United States Patent
Akao et al.

(10) Patent No.: US 8,394,728 B2
(45) Date of Patent: Mar. 12, 2013

(54) FILM DEPOSITION METHOD AND MANUFACTURING METHOD OF SEMICONDUCTOR DEVICE

(75) Inventors: Hirotaka Akao, Tokyo (JP); Yuriko Kaino, Kanagawa (JP); Takahiro Kamei, Kanagawa (JP); Masaki Hara, Kanagawa (JP); Kenichi Kurihara, Kanagawa (JP)

(73) Assignee: Sony Corporation, Tokyo (JP)

( * ) Notice: Subject to any disclaimer, the term of this patent is extended or adjusted under 35 U.S.C. 154(b) by 94 days.

(21) Appl. No.: 12/694,342

(22) Filed: Jan. 27, 2010

(65) Prior Publication Data
US 2010/0197102 A1 Aug. 5, 2010

(30) Foreign Application Priority Data

Feb. 4, 2009 (JP) ................................. 2009-023219
Sep. 18, 2009 (JP) ................................. 2009-216362

(51) Int. Cl.
*H01L 21/469* (2006.01)
*H01L 21/31* (2006.01)

(52) U.S. Cl. .... 438/781; 438/780; 427/515; 257/E21.24

(58) Field of Classification Search .................. 438/151, 438/780, 781; 427/515
See application file for complete search history.

(56) References Cited

U.S. PATENT DOCUMENTS

| 2003/0045632 | A1* | 3/2003 | Shiho et al. .................... 524/861 |
| 2005/0181566 | A1* | 8/2005 | Machida et al. ............... 438/301 |

FOREIGN PATENT DOCUMENTS
JP 2002-246384 8/2002

* cited by examiner

*Primary Examiner* — Alexander Ghyka
(74) *Attorney, Agent, or Firm* — SNR Denton US LLP

(57) ABSTRACT

A film deposition method includes the steps of: coating a solution containing a polysilane compound on a substrate to form a coating film and then carrying out a first thermal treatment in an inert atmosphere, thereby forming the coating film into a silicon film; forming a coating film containing a polysilane compound on the silicon film and then carrying out a second thermal treatment in an inert atmosphere or a reducing atmosphere, thereby forming the coating film into a silicon oxide precursor film; and carrying out a third thermal treatment in an oxidizing atmosphere, thereby forming the silicon oxide precursor film into a silicon oxide film and simultaneously densifying the silicon film.

9 Claims, 12 Drawing Sheets

THIRD THERMAL TREATMENT

FIRST THERMAL TREATMENT

SECOND THERMAL TREATMENT

THIRD THERMAL TREATMENT

FIRST THERMAL TREATMENT

SECOND THERMAL TREATMENT

THIRD THERMAL TREATMENT

FIRST THERMAL TREATMENT

SECOND THERMAL TREATMENT

THIRD THERMAL TREATMENT

FILM DEPOSITION METHOD AND MANUFACTURING METHOD OF SEMICONDUCTOR DEVICE

BACKGROUND OF THE INVENTION

1. Field of the Invention

The present invention relates to a film deposition method and a method for manufacturing a semiconductor device.

2. Description of the Related Art

A silicon oxide film is used as an insulating film, a dielectric film or a surface protective film in preparing a semiconductor device such as field effect transistors.

As to a method for forming such a silicon oxide film, the formation has been carried out in a vapor phase process such as a thermal oxidation method, a chemical vapor deposition method (CVD method) and a sputtering method.

Meanwhile, a liquid phase process includes film deposition by means of hydrolysis of an alkoxysilane or the like; and a formation method by mans of oxidization of a polysilazane or the like.

For example, there is disclosed a method for forming a silicon oxide film by forming a coating film containing a polysilane compound and oxidizing the coating film (see, for example, JP-A-2002-246384).

However, with respect to the foregoing methods, the vapor phase process is a method in which in the vapor phase process, it is necessary to use an expensive vacuum system or a dangerous gas raw material. Also, this vapor phase process is a method in which the energy consumption is large due to a high temperature or use of plasma or the like.

Also, the vapor phase process involves problems such as restrictions in size of a substrate on which a film is formed and uniformity.

Furthermore, the liquid phase process involves a problem such as densification of a film.

Also, according to the thermal oxidation method, not only an insulating film having a thickness of several nm can be formed with good control, but its defect density is low as $10^{10}$ $cm^{-2} eV^{-1}$. However, since this method includes a process of about 1,000° C., glass or an organic material (a resin, for example, polycarbonates, polystyrenes, polyimides, etc.) cannot be used as a substrate material.

Also, according to the CVD method or the sputtering method, the process temperature is lower than that in the method for forming a thermally oxidized film. However, its defect density is high as $10^{12}$ $cm^{-2} eV^{-1}$, and it is difficult to form an insulating film having a thickness of several nm with good control.

Furthermore, in an insulating film using a polysilazane or the like, which is used for an interlayer insulating film, a low-temperature process of from about 200° C. to 500° C. is possible. However, its defect density is very high.

SUMMARY OF THE INVENTION

The present inventors recognized a problem that it is difficult to realize film deposition of a silicon oxide film which is low in a defect density by a low-temperature process without adopting film deposition in a vacuum atmosphere.

The present inventors address the above-identified and other problems and have made effort to realize film deposition of a silicon oxide film which is low in a defect density by a low-temperature process without adopting film deposition in a vacuum atmosphere.

A film deposition method according to embodiments of the present invention includes the steps of coating a solution containing a polysilane compound on a substrate to form a coating film and then carrying out a first thermal treatment in an inert atmosphere or a reducing atmosphere, thereby forming the coating film into a silicon film; forming a coating film containing a polysilane compound on the silicon film and then carrying out a second thermal treatment in an inert atmosphere or a reducing atmosphere, thereby forming the coating film into a silicon oxide precursor film; and carrying out a third thermal treatment in an oxidizing atmosphere, thereby forming the silicon oxide precursor film into a silicon oxide film and simultaneously densifying the silicon film.

In the film deposition method according to the embodiment of the present invention, the film deposition is realized in an inert atmosphere and a reducing atmosphere, and therefore, film deposition in a vacuum atmosphere is not necessary. Also, after forming a silicon oxide precursor film, the thermal treatment is carried out in an oxidizing atmosphere, and therefore, a dense silicon oxide film is formed.

A method for manufacturing a semiconductor device according to one embodiment of the present invention (first manufacturing method) includes the steps of coating a solution containing a polysilane compound on a substrate to form a coating film and then carrying out a first thermal treatment in an inert atmosphere or a reducing atmosphere, thereby forming the coating film into a silicon film; forming a coating film containing a polysilane compound on the silicon film and then carrying out a second thermal treatment in an inert atmosphere or a reducing atmosphere, thereby forming the coating film into a silicon oxide precursor film; carrying out a third thermal treatment in an oxidizing atmosphere, thereby forming the silicon oxide precursor film into a silicon oxide film and simultaneously densifying the silicon film; forming a gate electrode on the silicon oxide film; and forming a source/drain region in the silicon film on the both sides of the gate electrode.

In the first manufacturing method of a semiconductor device according to the embodiment of the present invention, the film deposition is realized in an inert atmosphere and a reducing atmosphere, and therefore, film deposition in a vacuum atmosphere is not necessary. Also, after forming a silicon oxide precursor film, the thermal treatment is carried out in an oxidizing atmosphere, and therefore, a gate insulating film composed of a dense silicon oxide film is formed. Also, in the third thermal treatment, densification of the silicon film is achieved, and therefore, an active region with good crystallinity can be formed.

A method for manufacturing a semiconductor device according to another embodiment of the present invention (second manufacturing method) includes the steps of forming a silicon film on a substrate and forming a thin film transistor using the silicon film for an active layer; and forming a hydrogen-containing silicon oxide film on the substrate, thereby covering the thin film transistor, wherein the step of forming a silicon film includes coating a solution containing a polysilane compound on the substrate to form a coating film and then carrying out a first thermal treatment in an inert atmosphere or a reducing atmosphere, thereby forming the coating film into a silicon film; and the step of forming a hydrogen-containing silicon oxide film includes the steps of forming a coating film containing a polysilane compound so as to cover the thin film transistor on the substrate and then carrying out a second thermal treatment in an inert atmosphere or a reducing atmosphere, thereby forming the coating film into a silicon oxide precursor film and carrying out a third thermal treatment in an oxidizing atmosphere, thereby forming a hydrogen-containing silicon oxide film from the silicon oxide precursor film.

In the second manufacturing method of a semiconductor device according to the embodiment of the present invention, the film deposition is realized in an inert atmosphere and a reducing atmosphere, and therefore, film deposition in a vacuum atmosphere is not necessary. Also, in the second thermal treatment in a reducing atmosphere, the silicon oxide precursor film is formed from the coating film containing a polysilane compound, and therefore, hydrogen is contained in the film. The silicon oxide precursor film in a hydrogen-containing state is subjected to the third thermal treatment in an oxidizing atmosphere, and therefore, a hydrogen-containing dense silicon oxide film is obtained. Also, in the third thermal treatment, densification of the silicon film of a thin film transistor is achieved, and therefore, an active region with good crystallinity can be formed.

In the film deposition method according to the embodiments of the present invention, film deposition of a silicon oxide film which is low in a defect density can be realized by a low-temperature process without adopting film deposition in a vacuum atmosphere.

In the first manufacturing method of a semiconductor device according to the embodiment of the present invention, film deposition of a silicon oxide film which is low in a defect density can be realized by a low-temperature process without adopting film deposition in a vacuum atmosphere. Also, agate insulating film composed of a dense silicon oxide film can be realized, and therefore, a semiconductor device (FET) which is free from gate leakage can be realized. Furthermore, crystallinity of a silicon film is enhanced, and therefore, a semiconductor device (FET) with excellent characteristics can be realized.

In the second manufacturing method of a semiconductor device according to the embodiment of the present invention, a silicon oxide film in a hydrogen-containing state, which is low in a defect density, can be realized by a low-temperature process without adopting film deposition in a vacuum atmosphere.

Each of FIGS. 6A to 6D is a manufacturing step sectional view showing a second example of a film deposition method according to the first embodiment of the present invention.

Figure 7A:
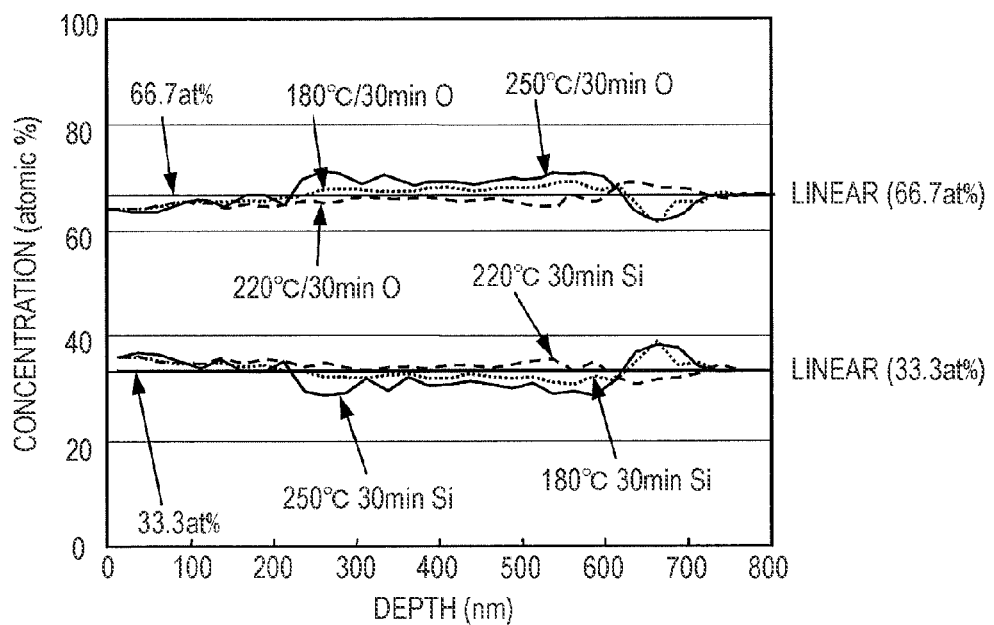
Figure 7B:
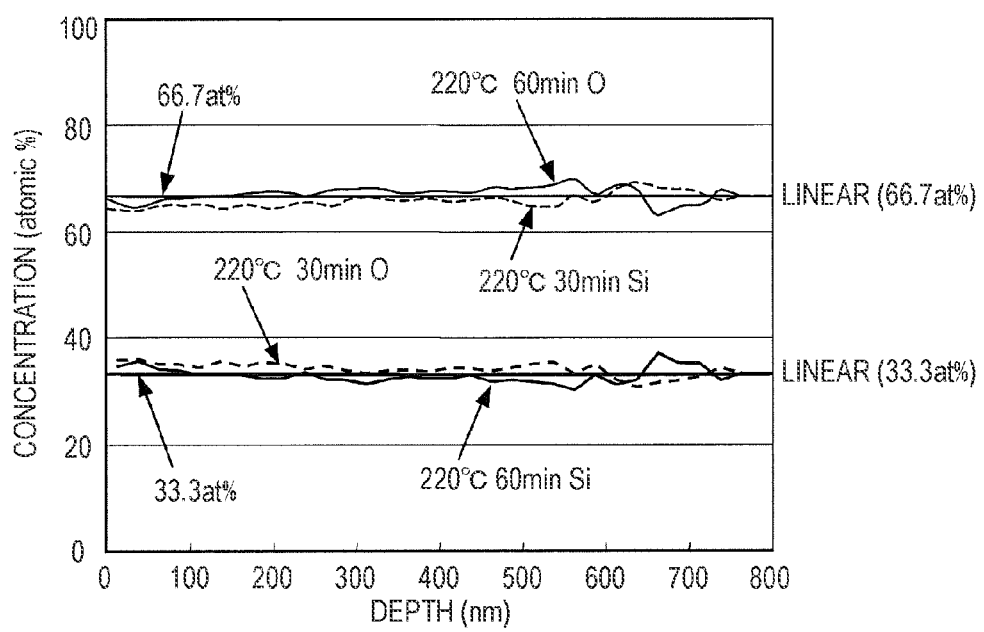

FIGS. 7A to 7B illustrate graphs showing an existence ratio of silicon (Si) and oxygen (O) in a thickness direction of a hydrogen-containing silicon oxide film by the Rutherford backscattering spectrometry (RBS).

Figure 8:
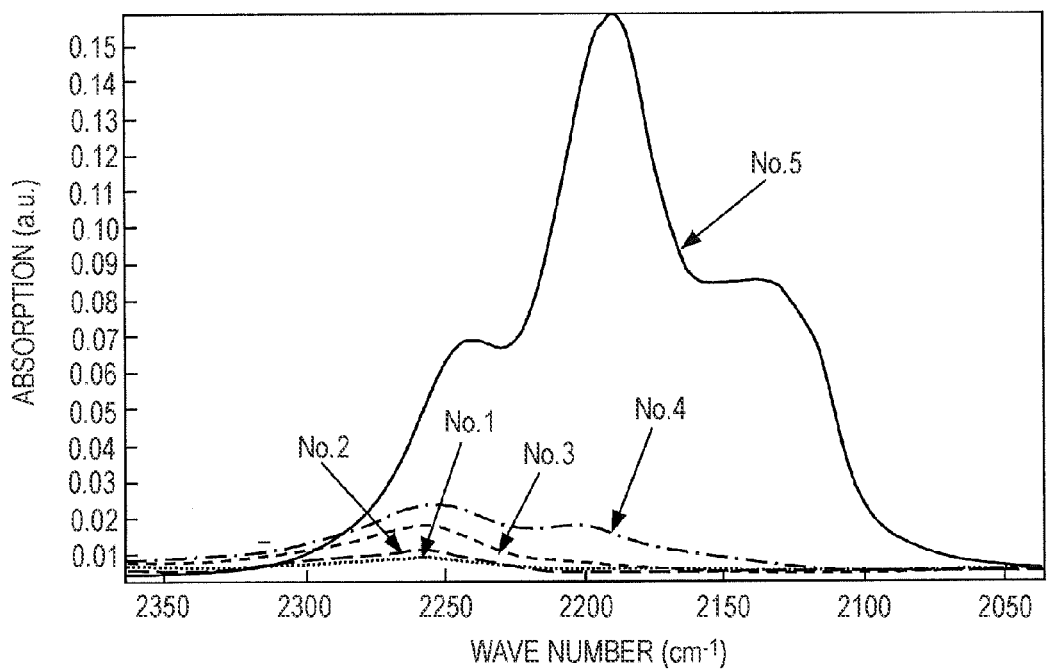

FIG. 8 is a spectral (transmissive) diagram of a hydrogen-containing silicon oxide film by the Fourier transform infrared spectroscopy (FT-IR).

Figure 9:
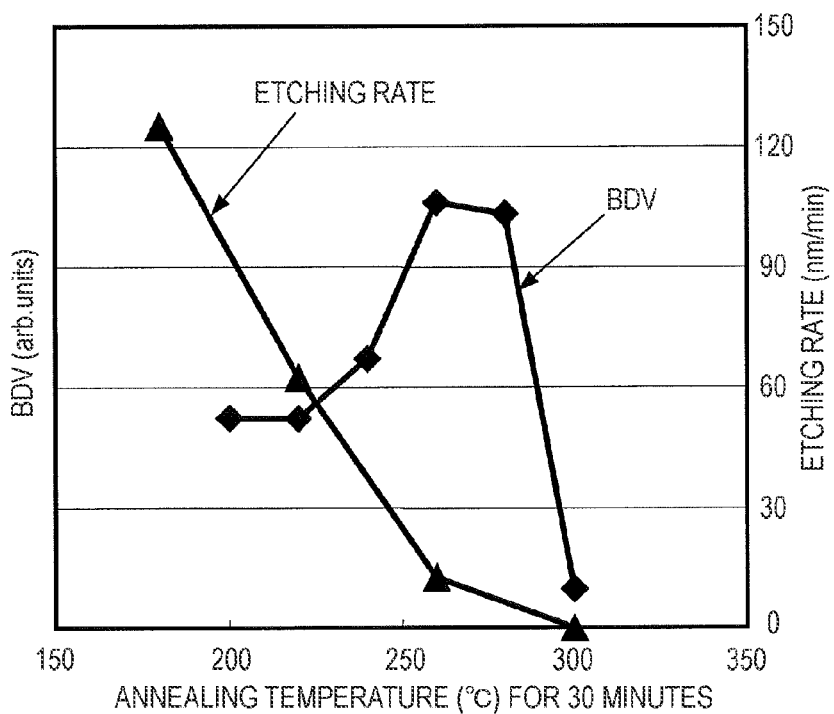

FIG. 9 is a relational diagram among a breakdown voltage (BDV), an etching rate and an annealing temperature.

FIGS. 10A to 10F illustrate manufacturing step sectional views showing a first example of a manufacturing method of a semiconductor device according to a second embodiment of the present invention.

FIGS. 11A to 11D illustrate manufacturing step sectional views showing a second example of a manufacturing method of a semiconductor device according to the second embodiment of the present invention.

Figure 12:
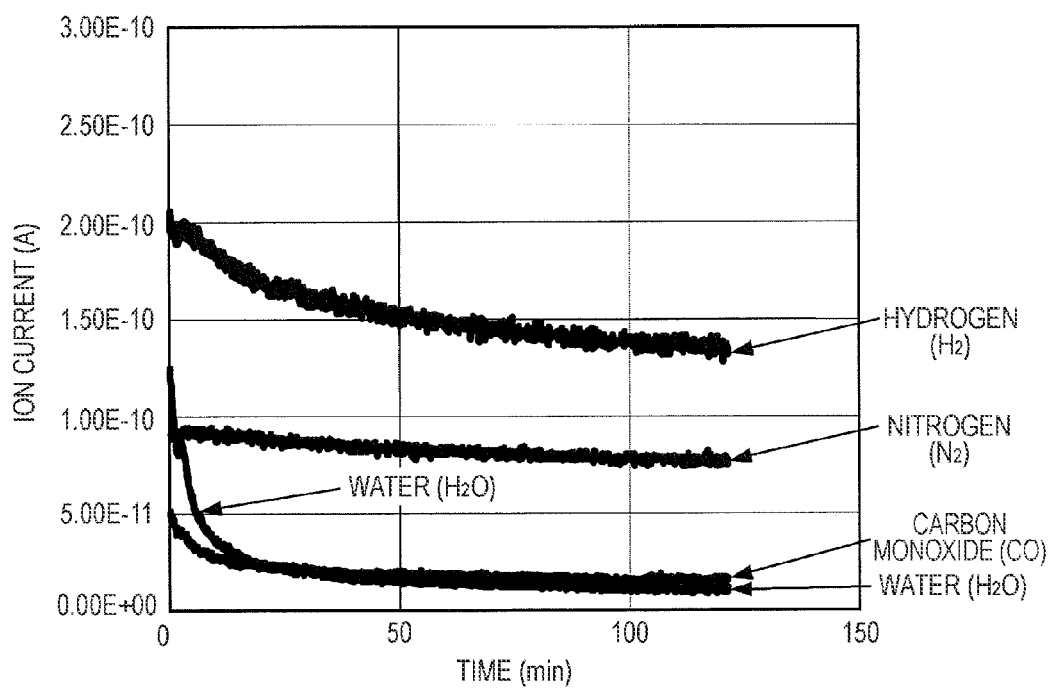

FIG. 12 is a relational diagram between an ion current expressing a degassing amount from a hydrogen-containing silicon oxide film, which is a measured value by the thermal desorption spectroscopy (TDS), and a holding time.

Figure 13:
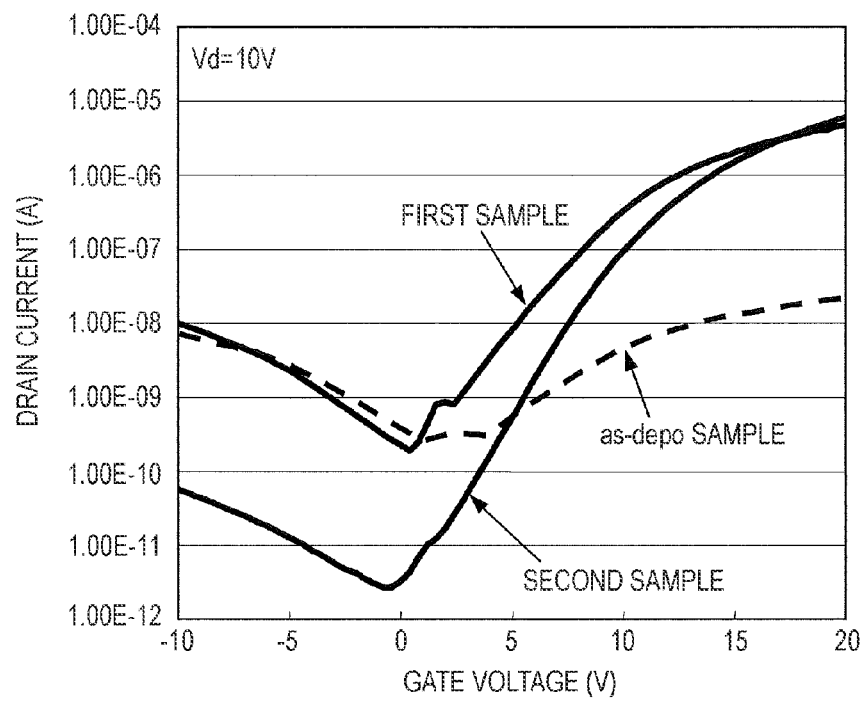

FIG. 13 is a relational diagram between a drain current and a gate voltage of a sample.

Figure 14:
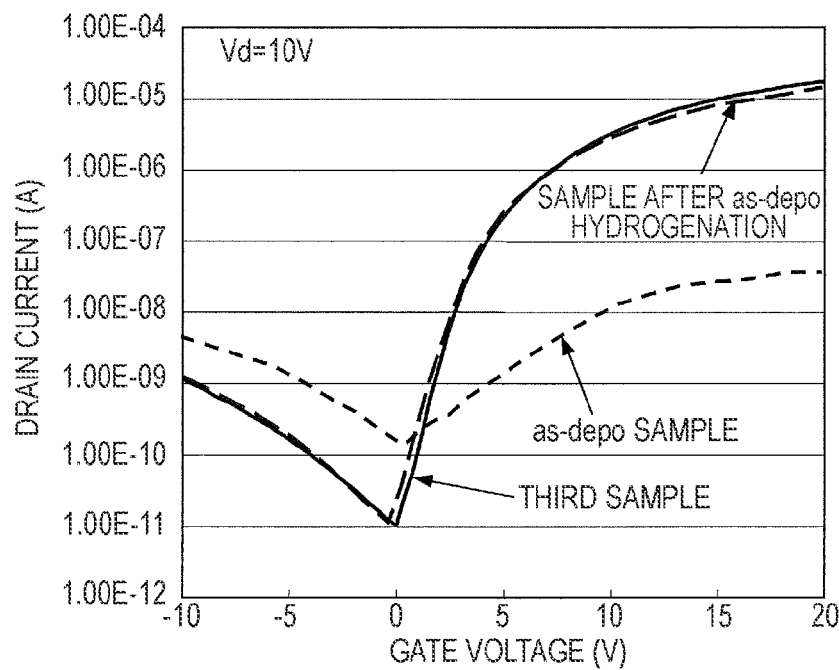

FIG. 14 is a relational diagram between a drain current and a gate voltage of a sample.

Figure 15:
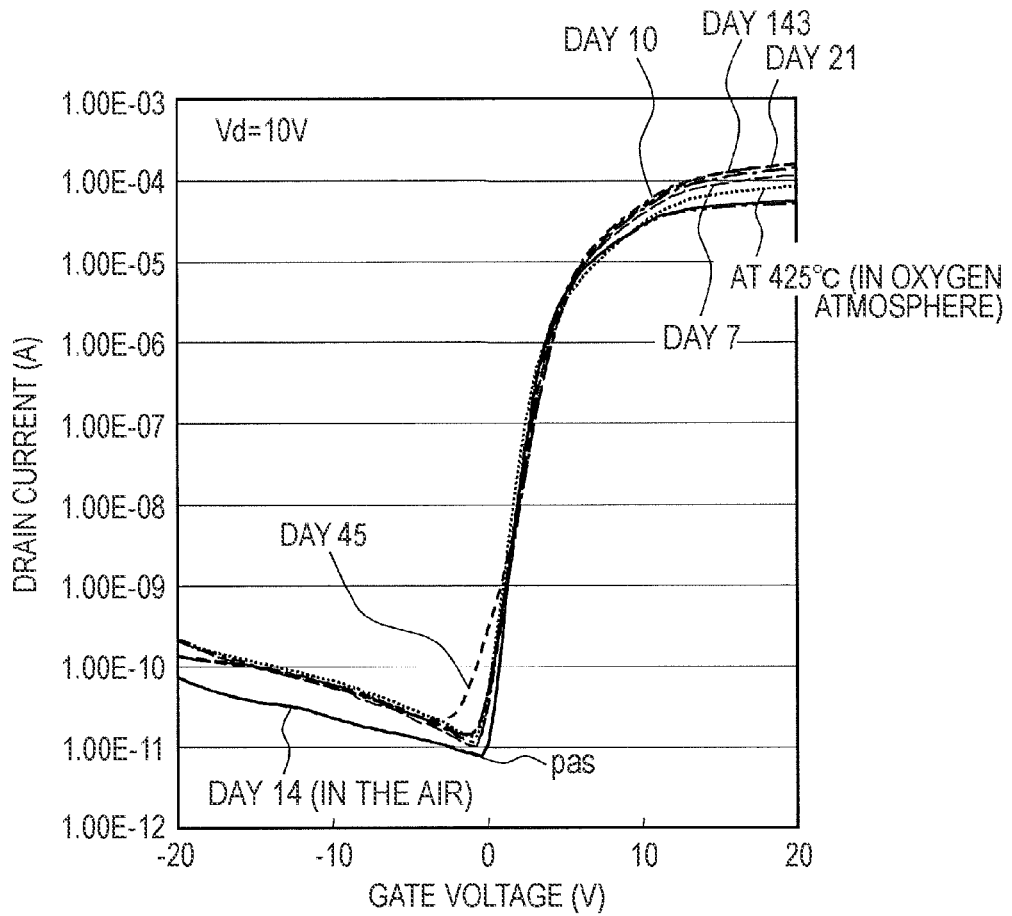

FIG. 15 is a relational diagram between a drain current and a gate voltage of a sample.

DESCRIPTION OF THE PREFERRED EMBODIMENTS

Best modes for carrying out the present invention (hereinafter referred to as embodiments) is hereunder described.
<1. First Embodiment>
[First Example of Film Deposition Method]

A first example of the film deposition method according to a first embodiment of the present invention is described with reference to a manufacturing step sectional view shown in each of FIGS. 1A to 1C.

Figure 1A:
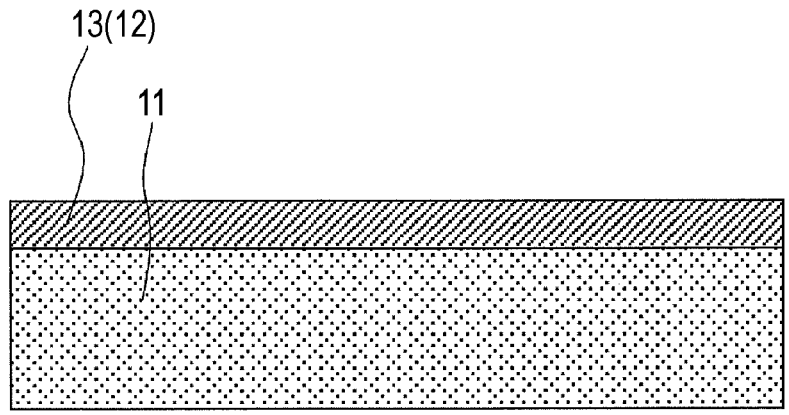
FIGS. 1A to 1C illustrate manufacturing step sectional views showing a first example of a film deposition method according to a first embodiment of the present invention.

As shown in FIG. 1A, a solution containing a polysilane compound is coated on a substrate 11 to form a coating film 12, which is then subjected to a first thermal treatment in an inert atmosphere, thereby forming the coating film 12 into a silicon film 13.

A step of forming the coating film 12 is preferably carried out in an inert atmosphere of argon, nitrogen or the like. Alternatively, hydrogen may be contained in a reducing atmosphere.

Figure 2:
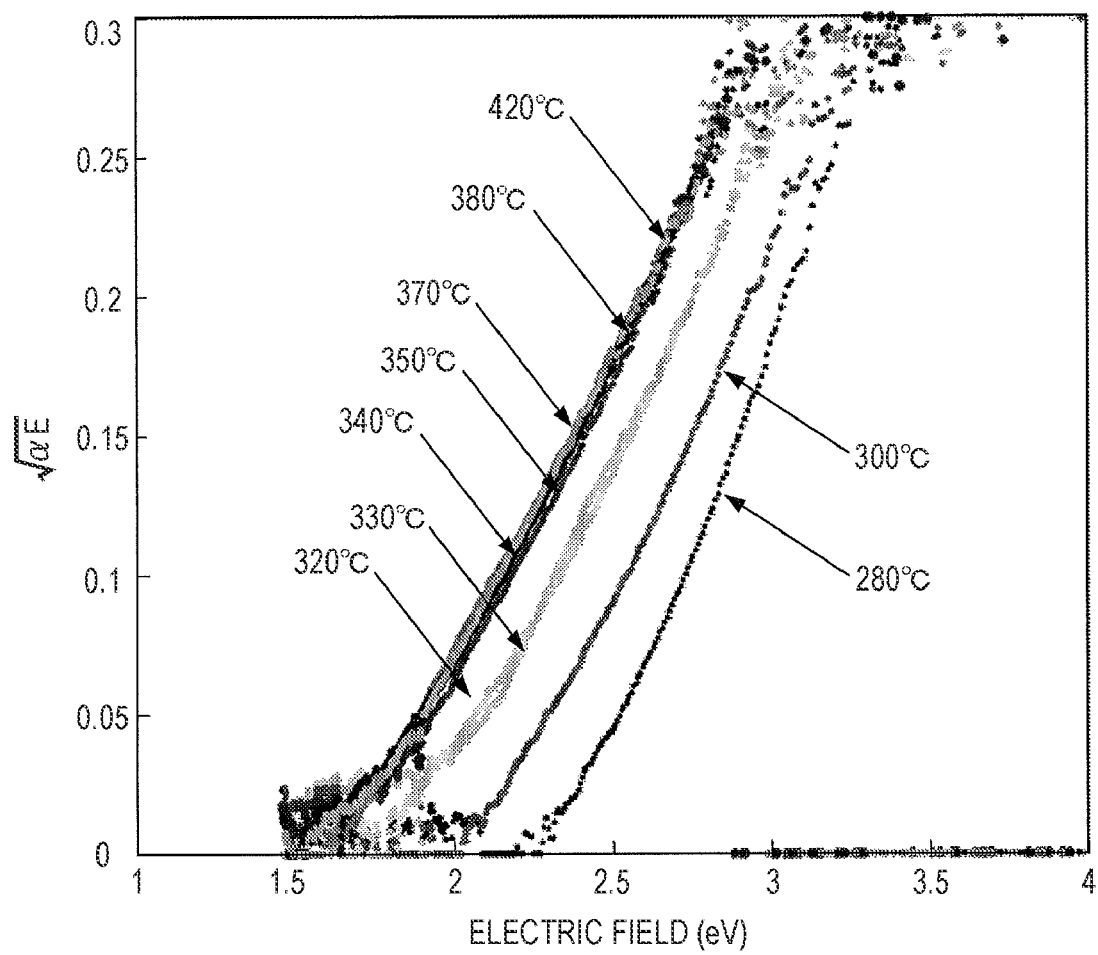
FIG. 2 is a graph showing band gap dependency of a silicon film upon a first thermal treatment temperature.

As shown in FIG. 2, when the first thermal treatment is carried out at a temperature of 300° C. or higher in an inert atmosphere of argon, nitrogen or the like, a band gap of the silicon film 13 becomes not more than 2 eV. The temperature at which it reaches a stable region is about 340° C. or higher.

As to an upper limit thereof, the thermal treatment is carried out at a temperature of not higher than 600° C. in an inert atmosphere of argon, nitrogen or the like. When the temperature exceeds 600° C., there is a possibility that the silicon film 13 is broken.

The polysilane compound is one represented by $Si_nR_m$ (wherein n represents a natural number of 3 or more; m is a number of $(2n-2)$ or more and not more than $(2n+2)$; and R represents an organic chain material, an organic cyclic material, a hydrogen atom, a halogen atom or a metal atom).

When the foregoing R is a hydrogen atom, specific examples of the chain polysilane compound include normal tetrasilane ($Si_4H_{10}$), isotetrasilane ($Si_4H_{10}$), normal pentasilane ($Si_5H_{12}$), isopentasilane ($Si_5H_{12}$), neopentasilane ($Si_5H_{12}$), normal hexasilane ($Si_6H_{14}$), normal heptasilane ($Si_7H_{16}$), normal octasilane ($Si_8H_{18}$), normal nonasilane ($Si_9H_{2}O$) and isomers thereof.

Also, examples of the cyclic polysilane compound include cyclotetrasilane ($Si_4H_8$), cyclopentasilane ($Si_5H_{10}$), cyclohexasilane ($Si_6H_{12}$) and cycloheptasilane ($Si_7H_{14}$). Besides, cage-shaped polysilane compounds and the like are exemplified.

Also, monosilane ($SiH_4$), disilane ($Si_2H_6$) or trisilane ($Si_3H_8$) in which the foregoing n is less than 3 may be coexistent.

Here, cyclopentasilane ($Si_5H_{10}$) is used singly as an example.

As the foregoing cyclopentasilane, a synthesized material may be used as it is. Alternatively, a previously isolated material may be used.

In the case of synthesizing cyclopentasilane, for example, phenyldichlorosilane is cyclized with metallic lithium in tetrahydrofuran, thereby forming decaphenylcyclopentasilane.

Subsequently, decaphenylcyclopentasilane is treated with hydrogen chloride in the presence of aluminum chloride and further treated with lithium aluminum hydride and a silica gel. There can be thus produced cyclopentasilane.

Subsequently, the foregoing cyclopentasilane is dissolved in an appropriate solvent, thereby obtaining a solution containing a polysilane compound.

That is, the foregoing solution containing a polysilane compound is one having the polysilane compound dissolved in a solvent.

The solvent is not particularly limited so far as it is able to dissolve cyclopentasilane therein and is not reactive with cyclopentasilane.

Examples of such a solvent which is preferable include hydrocarbon based solvents (for example, n-heptane, n-octane, decane, toluene, xylene, cymene, durene, indene, dipentene, tetrahydronaphthalene, decahydronaphthalene, cyclohexylbenzene, etc.); ether based solvents (for example, ethylene glycol dimethyl ether, ethylene glycol diethyl ether, ethylene glycol methylethyl ether, diethylene glycol dimethyl ether, diethylene glycol methylethyl ether, 1,2-dimethoxyethane, bis(2-methoxyethyl)ether, p-dioxane, etc.); and aprotic polar solvents (for example, propylene carbonate, γ-butyrolactone, n-methyl-2-pyrrolidone, dimethylformaldehyde, dimethyl sulfoxide, cyclohexanone, etc.).

Such a solvent can be used singly or in admixture of two or more kinds thereof.

Here, for example, a cyclopentasilane solution having cyclopentasilane dissolved in toluene was formed.

As to the foregoing solvent, it is more preferable to use a solvent such as cyclohexanone, toluene and xylene in view of easiness of handling.

A surfactant may be contained in the foregoing solution.

Figure 1B:
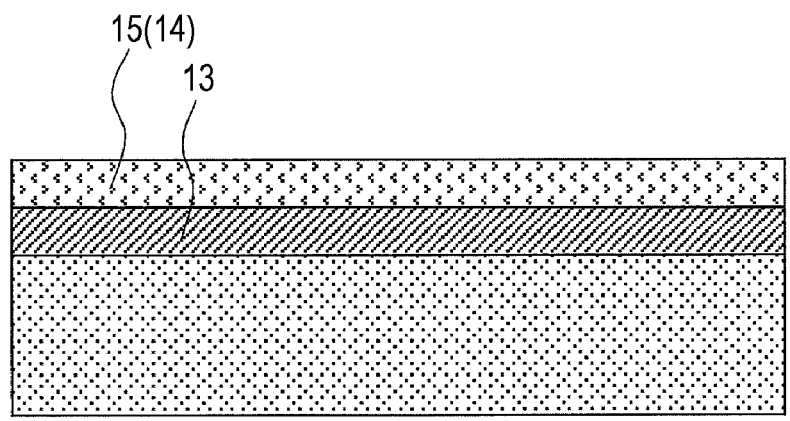

Subsequently, as shown in FIG. 1B, a coating film 14 containing a polysilane compound is formed on the silicon film 13 and then subjected to a second thermal treatment in an inert atmosphere, thereby forming the coating film 14 into a silicon oxide precursor film 15.

A step of forming the coating film 14 is preferably carried out in an inert atmosphere of argon, nitrogen or the like. Alternatively, hydrogen may be contained in a reducing atmosphere.

The second thermal treatment is carried out at a temperature of 200° C. or higher and not higher than 280° C. in an inert atmosphere of argon, nitrogen or the like.

Similar to the above-described case, the foregoing polysilane compound is one represented by $Si_nR_m$ (wherein n represents a natural number of 3 or more; m is a number of (2n−2) or more and not more than (2n+2); and R represents an organic chain material, an organic cyclic material, a hydrogen atom, a halogen atom or a metal atom).

When the foregoing R is a hydrogen atom, specific examples of the chain polysilane compound include normal tetrasilane ($Si_4H_{10}$), isotetrasilane ($Si_4H_{10}$), normal pentasilane ($Si_5H_{12}$), isopentasilane ($Si_5H_{12}$), neopentasilane ($Si_5H_{12}$), normal hexasilane ($Si_6H_{14}$), normal heptasilane ($Si_7H_{16}$), normal octasilane ($Si_8H_{18}$), normal nonasilane ($Si_9H_2O$) and isomers thereof.

Also, examples of the cyclic polysilane compound include cyclotetrasilane ($Si_4H_8$), cyclopentasilane ($Si_5H_{10}$), cyclohexasilane ($Si_6H_{12}$) and cycloheptasilane ($Si_7H_{14}$). Besides, cage-shaped polysilane compounds and the like are exemplified.

Also, monosilane ($SiH_4$), disilane ($Si_2H_6$) or trisilane ($Si_3H_8$) in which the foregoing n is less than 3 may be coexistent.

Here, cyclopentasilane ($Si_5H_{10}$) is used singly as an example.

As the foregoing cyclopentasilane, a synthesized material may be used as it is. Alternatively, a previously isolated material may be used.

In the case of synthesizing cyclopentasilane, for example, phenyldichlorosilane is cyclized with metallic lithium in tetrahydrofuran, thereby forming decaphenylcyclopentasilane.

Subsequently, decaphenylcyclopentasilane is treated with hydrogen chloride in the presence of aluminum chloride and further treated with lithium aluminum hydride and a silica gel. There can be thus produced cyclopentasilane.

Subsequently, the foregoing cyclopentasilane is dissolved in an appropriate solvent, thereby obtaining a solution containing a polysilane compound.

That is, the foregoing solution containing a polysilane compound is one having the polysilane compound dissolved in a solvent.

The solvent is not particularly limited so far as it is able to dissolve cyclopentasilane therein and is not reactive with cyclopentasilane.

Examples of such a solvent which is preferable include hydrocarbon based solvents (for example, n-heptane, n-octane, decane, toluene, xylene, cymene, durene, indene, dipentene, tetrahydronaphthalene, decahydronaphthalene, cyclohexylbenzene, etc.); ether based solvents (for example, ethylene glycol dimethyl ether, ethylene glycol diethyl ether, ethylene glycol methylethyl ether, diethylene glycol dimethyl ether, diethylene glycol methylethyl ether, 1,2-dimethoxyethane, bis(2-methoxyethyl)ether, p-dioxane, etc.); and aprotic polar solvents (for example, propylene carbonate, γ-butyrolactone, n-methyl-2-pyrrolidone, dimethylformaldehyde, dimethyl sulfoxide, cyclohexanone, etc.).

Such a solvent can be used singly or in admixture of two or more kinds thereof.

Here, for example, a cyclopentasilane solution having cyclopentasilane dissolved in toluene was formed.

As to the foregoing solvent, it is more preferable to use a solvent such as cyclohexanone, toluene and xylene in view of easiness of handling.

A surfactant may be contained in the foregoing solution.

Figure 1C:
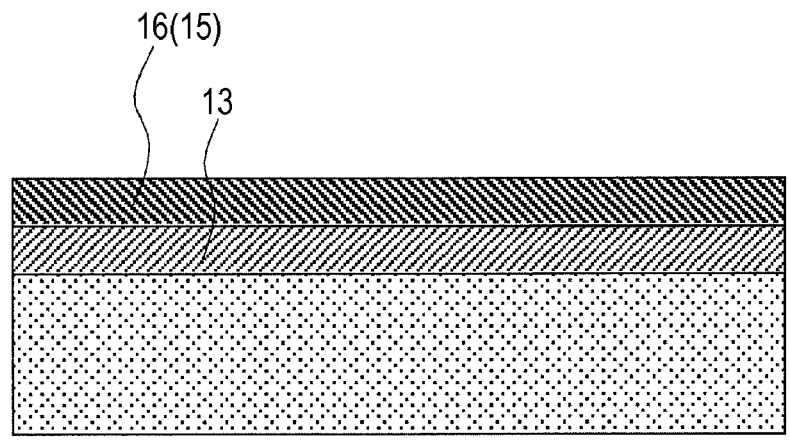

Subsequently, as shown in FIG. 1C, a third thermal treatment is carried out in an oxidizing atmosphere, thereby forming the silicon oxide precursor film 15 into a silicon oxide film 16. At the same time, the crystallinity of the silicon film 13 is densified.

A maximum temperature of the third thermal treatment is higher than a maximum temperature of the second thermal treatment.

Here, the temperature of the third thermal treatment is described.

An aluminum electrode (not illustrated) was formed on the silicon oxide film 16, and a C-V characteristic was measured at 1 MHz using a capacity-voltage (C-V) characteristic analyzer (for example, 4284A, manufactured by Agilent Technologies).

Figure 3A:
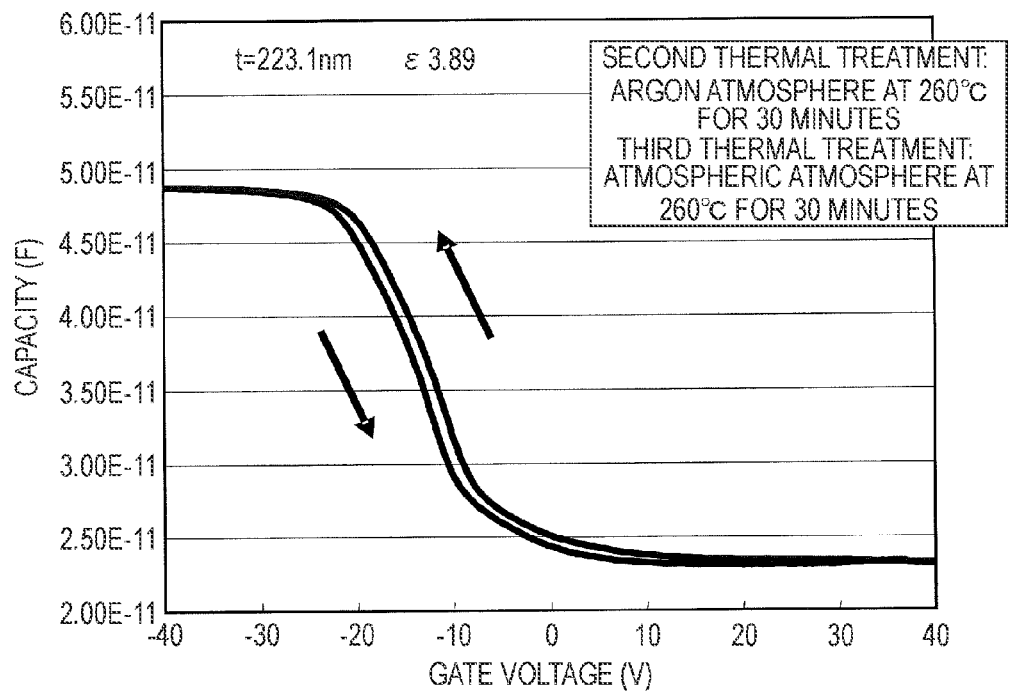
FIGS. 3A to 3B illustrate C-V characteristic curves measured upon forming an aluminum electrode on a laminated film of a silicon film and a silicon oxide film.
Figure 3B:
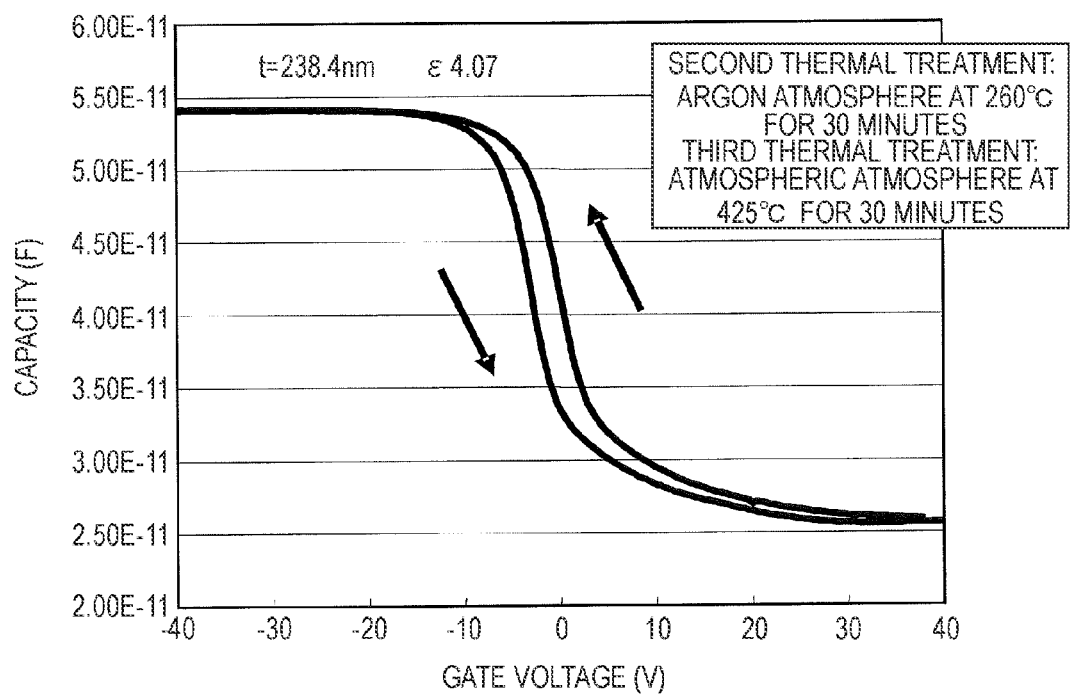

The results obtained are shown in FIGS. 3A to 3B. FIG. 3A is concerned with a C-V characteristic in the case where the second thermal treatment was carried out at 260° C. in an inert atmosphere, and the third thermal treatment was carried out at 260° C. in an oxidizing atmosphere. FIG. 3B is concerned with a C-V characteristic in the case where the second thermal treatment was carried out at 260° C. in an inert atmosphere, and the third thermal treatment was carried out at 425° C. in an oxidizing atmosphere.

As shown in FIGS. 3A to 3B, in order to form a silicon oxide film with good characteristics, it is understood that it is desirable to set up the temperature of the third thermal treatment higher than 260° C. which is the temperature of the second thermal treatment.

This is merely an example, and the same results were obtained at other temperatures.

By setting up the maximum temperature of the third thermal treatment higher than the maximum temperature of the second thermal treatment, an interface between the silicon film 13 and the silicon oxide film 16 is able to obtain a good interface characteristic.

Also, it was understood that a defect density of the silicon oxide film 16 can be reduced.

Figure 4:
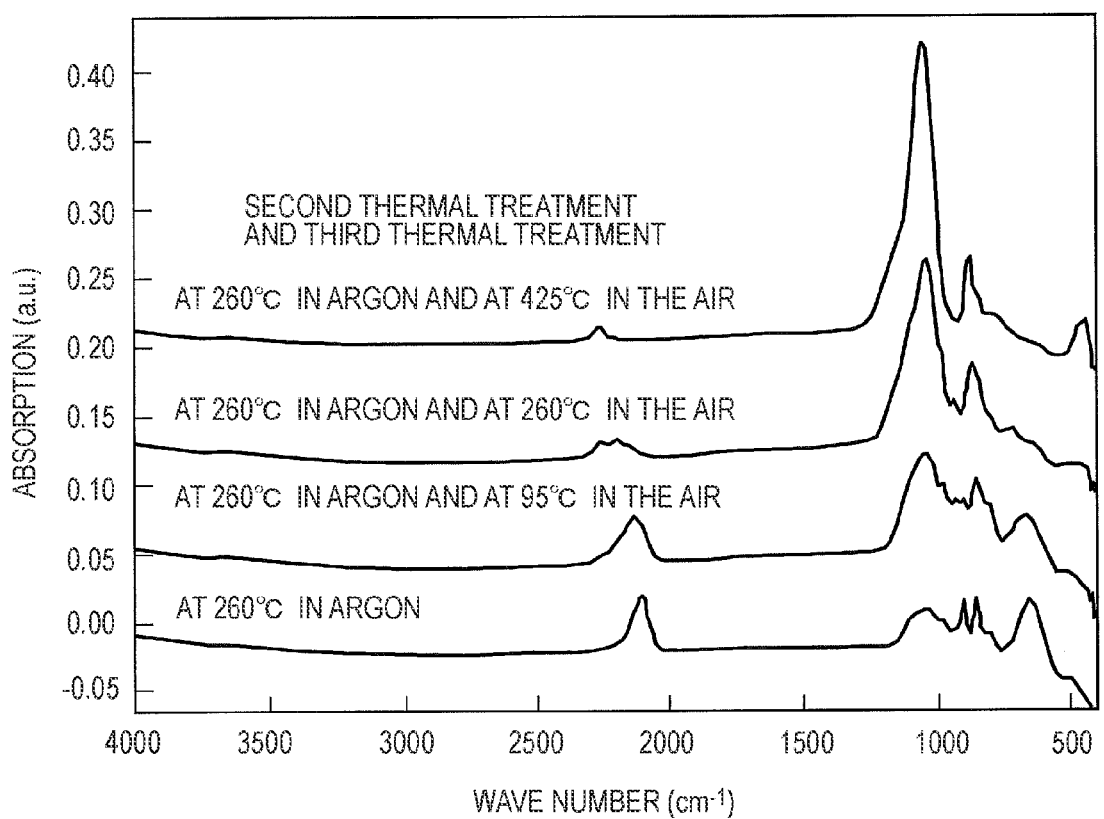
FIG. 4 is an FT-IR spectral diagram by a temperature of a third thermal treatment.

Also, the results obtained by measuring an optical spectrum (transmission) by the Fourier transform infrared spectroscopy (FT-IR) while changing the temperature of the third thermal treatment are shown in FIG. 4.

In order to form a silicon oxide film with good characteristics, four samples in which the temperature of the third thermal treatment was set up at 425° C., 260° C. and 95° C., respectively, and the third thermal treatment was not carried out were prepared. The results obtained are shown in FIG. 4.

As shown in FIG. 4, it was understood that the temperature at which the oxidation treatment in the third thermal treatment is efficiently carried out is higher than 95° C.

However, in the third thermal treatment, a temperature condition under which the silicon film 13 is not oxidized is required. The instant temperature is properly determined depending upon the thickness of the silicon oxide film 16, the quality of the substrate 11 and the like.

Also, in the third thermal treatment, besides the thermal treatment in an oxidizing atmosphere, an oxidation treatment with ozone may be carried out in addition to the thermal treatment, or an oxidation treatment upon irradiation with light may be carried out in addition to the thermal treatment.

Also, the silicon oxide film 16 was formed on a silicon single crystal substrate by the foregoing film deposition method.

Six samples in which the second thermal treatment was carried out at 200° C., 220° C., 240° C., 260° C., 280° C. and 300° C., respectively, and the third thermal treatment was carried out at 425° C. in all of the instances were formed.

An aluminum electrode (not illustrated) was formed thereon, and an I-V characteristic was measured using an I-V characteristic analyzer (for example, a device analyzer 4156C, manufactured by Agilent Technologies). The results obtained are shown in FIG. 5.

Figure 5:
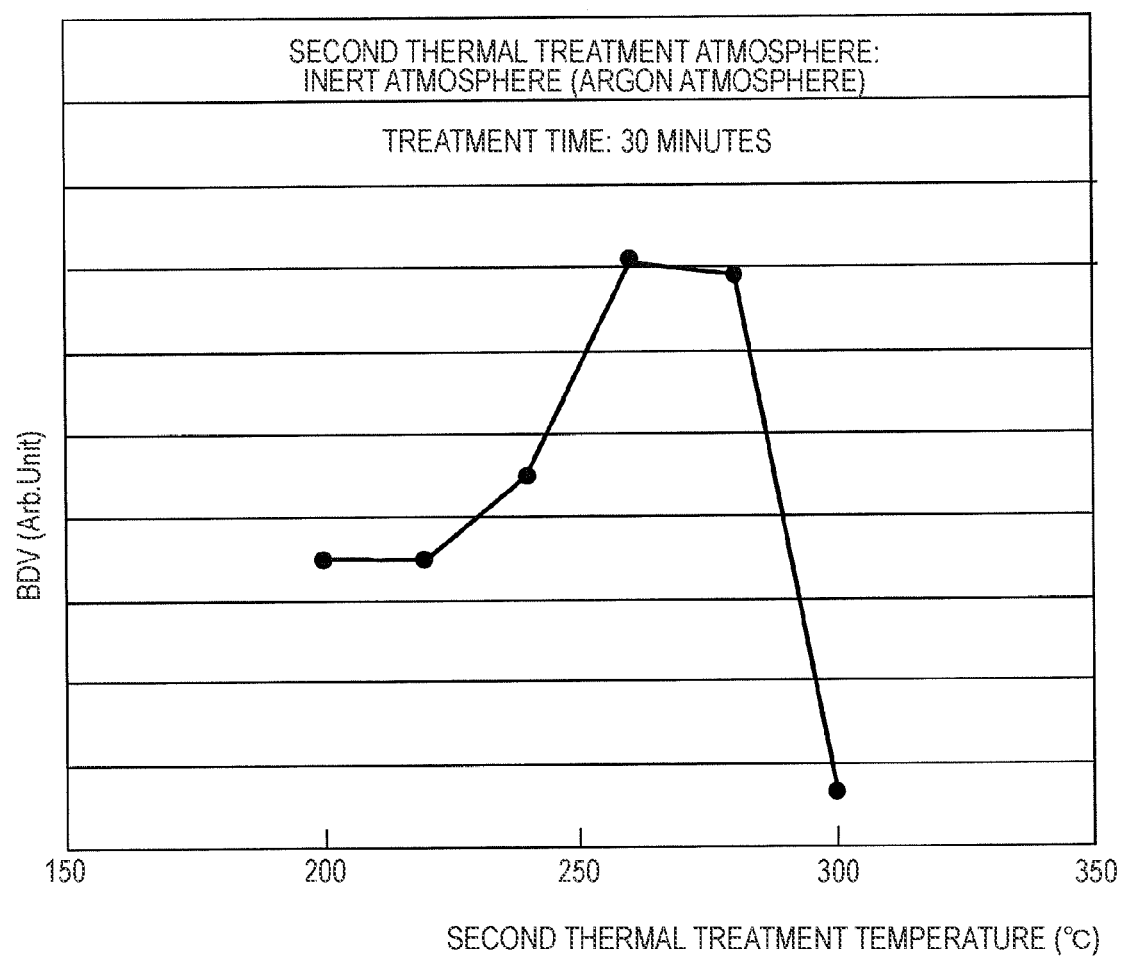
FIG. 5 is a graph showing a resistance value by a temperature of a third thermal treatment.

As shown in FIG. 5, it was understood that the resistance is high by the thermal treatment at 200° C. or higher and not higher than 280° C., whereas the resistance is low by the thermal treatment at about 300° C.

That is, it was understood that the silicon oxide precursor film 15 with good characteristics can be formed at 200° C. or higher and not higher than 280° C., whereas the oxidation is not promoted at 300° C. or higher, but the formation of a network of silicon is advanced.

Specifically, in the second thermal treatment, by carrying out the thermal treatment at 200° C. or higher, a network necessary for the oxidation of silicon is formed in the silicon film. The thermal treatment is carried out so as to avoid occurrence of a phenomenon in which the formation of a network of silicon is excessively advanced to cause an excessive increase of an —Si—Si—Si—bond, whereby there is no room for incorporation of oxygen (O). That is, a network of silicon is formed such that a bond which enables oxygen (O) to bond to the silicon film remains in silicon (Si). The instant temperature is set up at not higher than 280° C.

In consequence, the second thermal treatment is desirably carried out at 200° C. or higher and not higher than 280° C.

In the foregoing film deposition method, in addition to the polysilane compound such as the foregoing cyclopentasilane, a radical generator may be contained in the solution containing a polysilane compound.

Examples of such a radical generator include biimidazole based compounds, benzoin based compounds, triazine based compounds, acetophenone based compounds, benzophenone based compounds, α-diketone based compounds, polynucleic quinone based compounds, xanthone based compounds and azo based compounds.

The concentration of the polysilane compound to be contained in this solution can be regulated by a desired film coating condition and a thickness of the film.

Also, it is preferable to irradiate the thus regulated solution with an energy beam before or after the film coating.

The energy beam includes an ultraviolet region. Examples thereof include lamp rays of a low-pressure mercury vapor lamp, a high-pressure mercury vapor lamp, a deuterium lamp, etc. Also, discharge light of a noble gas of argon, krypton, xenon, etc. is exemplified. Furthermore, YAG laser light, argon laser light, carbon dioxide laser light, excimer laser light of XeF, XeCl, XeBr, KrF, KrCl, ArF, ArCl, etc. and the like can be used.

The irradiation energy is regulated by regulating an output and an irradiation time using the foregoing energy beam.

For example, in the case where the foregoing solution containing a polysilane compound before the film coating is irradiated with the foregoing energy beam, a polysilane compound (for example, cyclopentasilane) alone or a solution thereof containing a solvent is sealed in a container (cell) capable of being transmitted through an ultraviolet region, such as quartz, and an energy beam is irradiated from the outside of the container.

Also, in the case where the foregoing solution containing a polysilane compound is coated and then irradiated with the foregoing energy beam, a polysilane compound (for example, cyclopentasilane) alone or a solution thereof containing a solvent is dropped onto a substrate which is desired to be subjected to film coating from an upper part, and the instant droplet is irradiated with an energy beam from an upper part. On that occasion, the energy beam may be irradiated from a lower part of the substrate so far as the substrate is capable of transmitting the energy beam therethrough. Thereafter, the droplet is spread on the entire surface of the substrate, thereby forming a coating film.

Alternatively, a polysilane compound (for example, cyclopentasilane) alone or a solution thereof containing a solvent is spread onto a substrate which is desired to be subjected to film coating by an arbitrary method such as a spin coating method, a roll coating method, a screen printing method, an offset printing method, a spraying method and an inkjet method, thereby forming a coating film, which is then irradiated with an energy beam. Similar to the above-described case, the energy beam can be irradiated from an upper part or a lower part of a substrate so far as the substrate is capable of transmitting the energy beam therethrough.

In the case where the irradiation with an energy beam and the thermal treatment are carried out, the order does not matter.

However, in the case where the thermal treatment is carried out, it is preferable that the thermal treatment is carried out after spreading the solution containing a polysilane compound on the substrate, or after the irradiation with an energy beam.

In the first example of the film deposition method according to the embodiment of the present invention, a laminated film of the silicon film 13 and the silicon oxide film 16 can be formed by a low-temperature process such that the defect density is lower than that in the related art.

Also, different from the thermal oxidation method, the CVD method or the sputtering method, each of which is a technique for forming a silicon oxide film, according to the film deposition method of the foregoing first example, a vacuum-less process can be adopted.

In consequence, investment in plant and equipment can be reduced as compared with a manufacturing method adopting a vacuum process, and a laminated film of the silicon film 13 and the silicon oxide film 16 can be formed continuously and at low costs.

Furthermore, a silicon oxide film which is low in a defect density can also be prepared in a large area on a substrate with low heat resistance by a coating method and a simple and easy method which is concerned with a thermal treatment.

Second Example of Film Deposition Method

A second example of the film deposition method according to the first embodiment of the present invention is described with reference to a manufacturing step sectional view shown in FIGS. 6A to 6D. In this second example, a film deposition method of a hydrogen-containing silicon oxide film is described.

Figure 6A:
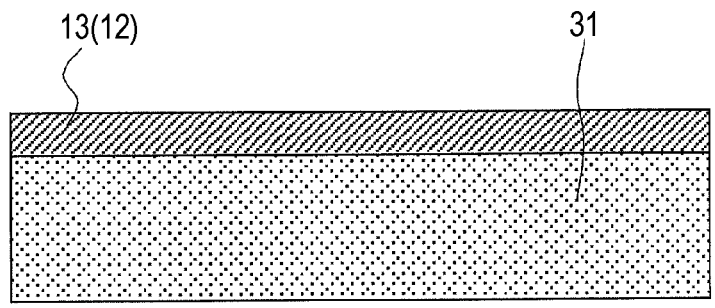

As shown in FIG. 6A, a solution containing a polysilane compound is coated on a substrate 31 to form a coating film 12, which is then subjected to a first thermal treatment in an inert atmosphere, thereby forming the coating film 12 into a silicon film 13.

A step of forming the coating film 12 is preferably carried out in an inert atmosphere of argon, nitrogen or the like. Alternatively, hydrogen may be contained in a reducing atmosphere.

Also, for example, a silicon substrate, a glass substrate, a quartz substrate or the like can be used for the substrate 31.

Figure 6B:
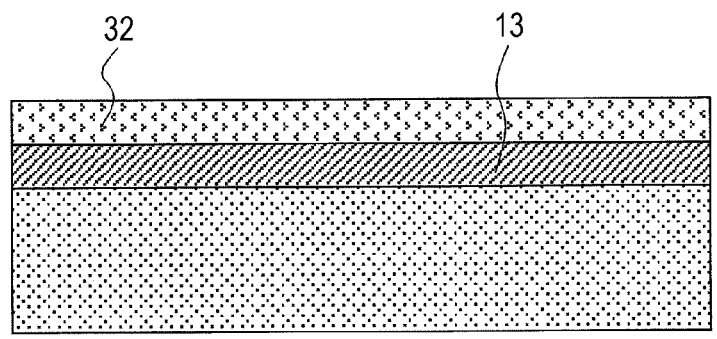

Subsequently, as shown in FIG. 6B, a coating film 32 containing a polysilane compound is formed on the silicon film 13.

As the polysilane compound, one represented by $Si_nR_m$ (wherein n represents a natural number of 3 or more; m is a number of $(2n-2)$ or more and not more than $(2n+2)$; and R represents an organic chain material, an organic cyclic material, a hydrogen atom, a halogen atom or a metal atom) is used.

When the foregoing R is a hydrogen atom, specific examples of the chain polysilane compound include normal tetrasilane ($Si_4H_{10}$), isotetrasilane ($Si_4H_{10}$) normal pentasilane ($Si_5H_{12}$), isopentasilane ($Si_5H_{12}$), neopentasilane ($Si_5H_{12}$), normal hexasilane ($Si_6H_{14}$), normal heptasilane ($Si_7H_{16}$), normal octasilane ($Si_8H_{18}$), normal nonasilane ($Si_9H_2O$) and isomers thereof.

Also, examples of the cyclic polysilane compound include cyclotetrasilane ($Si_4H_8$), cyclopentasilane ($Si_5H_{10}$), cyclohexasilane ($Si_6H_{12}$) and cycloheptasilane ($Si_7H_{14}$). Besides, cage-shaped polysilane compounds and the like are exemplified.

Also, monosilane ($SiH_4$), disilane ($Si_2H_6$) or trisilane ($Si_3H_8$) in which the foregoing n is less than 3 may be coexistent.

Here, cyclopentasilane ($Si_5H_{10}$) is used singly as an example.

As the foregoing cyclopentasilane, a synthesized material may be used as it is. Alternatively, a previously isolated material may be used.

In the case of synthesizing cyclopentasilane, for example, phenyldichlorosilane is cyclized with metallic lithium in tetrahydrofuran, thereby forming decaphenylcyclopentasilane.

Subsequently, decaphenylcyclopentasilane is treated with hydrogen chloride in the presence of aluminum chloride and further treated with lithium aluminum hydride and a silica gel. There can be thus produced cyclopentasilane.

Subsequently, the foregoing cyclopentasilane is dissolved in an appropriate solvent, thereby obtaining a solution containing a polysilane compound.

That is, the foregoing solution containing a polysilane compound is one having the polysilane compound dissolved in a solvent.

The solvent is not particularly limited so far as it is able to dissolve cyclopentasilane therein and is not reactive with cyclopentasilane.

Examples of such a solvent which is preferable include hydrocarbon based solvents (for example, n-heptane, n-octane, decane, toluene, xylene, cymene, durene, indene, dipentene, tetrahydronaphthalene, decahydronaphthalene, cyclohexylbenzene, etc.); ether based solvents (for example, ethylene glycol dimethyl ether, ethylene glycol diethyl ether, ethylene glycol methylethyl ether, diethylene glycol dimethyl ether, diethylene glycol methylethyl ether, 1,2-dimethoxyethane, bis(2-methoxyethyl)ether, p-dioxane, etc.); and aprotic polar solvents (for example, propylene carbonate, γ-butyrolactone, n-methyl-2-pyrrolidone, dimethylformaldehyde, dimethyl sulfoxide, cyclohexanone, etc.).

Such a solvent can be used singly or in admixture of two or more kinds thereof.

Here, for example, a cyclopentasilane solution having cyclopentasilane dissolved in toluene was formed.

In addition to the foregoing cyclopentasilane, a radical generator may be contained in this solution. Examples of such a radical generator include biimidazole based compounds, benzoin based compounds, triazine based compounds, acetophenone based compounds, benzophenone based compounds, α-diketone based compounds, polynucleic quinone based compounds, xanthone based compounds and azo based compounds.

The concentration of the polysilane compound to be contained in this solution can be regulated by a desired film coating condition and a thickness of the film.

Also, it is preferable to irradiate the thus regulated solution with an energy beam before or after the film coating.

The energy beam includes an ultraviolet region. Examples thereof include lamp rays of a low-pressure mercury vapor lamp, a high-pressure mercury vapor lamp, a deuterium lamp, etc. Also, discharge light of a noble gas of argon, krypton, xenon, etc. is exemplified. Furthermore, YAG laser light, argon laser light, carbon dioxide laser light, excimer laser light of xenon fluoride (XeF), xenon chloride (XeCl), xenon bromide (XeBr), krypton fluoride (KrF), krypton chloride (KrCl), argon fluoride (ArF), argon chloride (ArCl), etc. and the like can be used.

The irradiation energy is regulated by regulating an output and an irradiation time using the foregoing energy beam.

For example, in the case where the foregoing solution containing a polysilane compound before the film coating is irradiated with the foregoing energy beam, a polysilane compound (for example, cyclopentasilane) alone or a solution thereof containing a solvent is sealed in a container (cell) capable of being transmitted through an ultraviolet region, such as quartz, and an energy beam is irradiated from the outside of the container.

Also, in the case where the foregoing solution containing a polysilane compound is coated and then irradiated with the foregoing energy beam, a polysilane compound (for example, cyclopentasilane) alone or a solution thereof containing a solvent is dropped onto a substrate which is desired to be subjected to film coating from an upper part, and the instant droplet is irradiated with an energy beam from an upper part. On that occasion, the energy beam may be irradiated from a lower part of the substrate so far as the substrate is capable of transmitting the energy beam therethrough. Thereafter, the droplet is spread on the entire surface of the substrate, thereby forming a coating film.

Alternatively, a polysilane compound (for example, cyclopentasilane) alone or a solution thereof containing a solvent is spread onto a substrate which is desired to be subjected to film coating by an arbitrary method such as a spin coating method, a roll coating method, a screen printing method, an offset printing method, a spraying method and an inkjet method, thereby forming a coating film, which is then irradiated with an energy beam. Similar to the above-described case, the energy beam can be irradiated from an upper part or a lower part of a substrate so far as the substrate is capable of transmitting the energy beam therethrough.

The film coating step of forming the coating film 32 is preferably carried out in an inert atmosphere of argon, nitrogen or the like. Also, hydrogen may be contained as in a reducing atmosphere.

In the case where the coating film 32 is subjected to film coating and then subjected to a thermal treatment, similar to the film coating step, the thermal treatment is preferably carried out in an inert atmosphere of argon, nitrogen or the like. Also, this thermal treatment is preferably carried out at not higher than 600° C.

In the case where the irradiation with an energy beam and the thermal treatment are carried out, the order does not matter.

However, in the case where the thermal treatment is carried out, it is preferable that the thermal treatment is carried out after spreading the solution containing a polysilane compound on the substrate, or after the irradiation with an energy beam.

Subsequently, the coating film 32 is subjected to an oxidation treatment. Examples of this oxidation treatment include a thermal treatment in an oxidizing atmosphere, a treatment with ozone (a thermal treatment may be added) and a treatment upon irradiation with light (a thermal treatment may be added). Here, the thermal treatment in an oxidizing atmosphere is described as an example.

The oxidation treatment is required to include a treatment step including at least two stages.

Figure 6C:
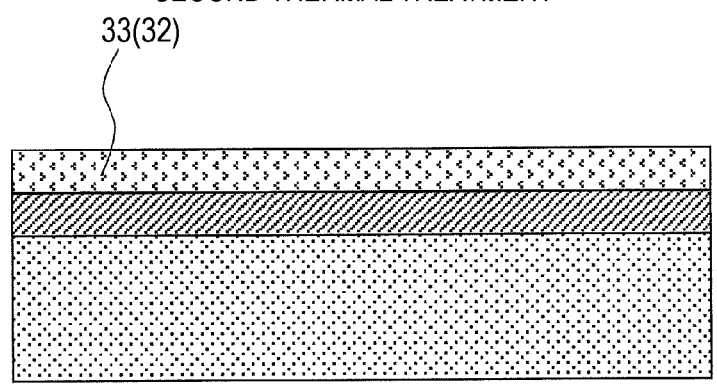

First of all, as shown in FIG. 6C, the treatment step at the first stage is a thermal treatment (second thermal treatment) in an inert atmosphere or a reducing atmosphere, and the thermal treatment is carried out at a thermal treatment temperature of 240° C. or higher and not higher than 280° C., and preferably 260° C. or higher and not higher than 280° C. in an inert atmosphere or a reducing atmosphere. According to this second thermal treatment, the coating film 32 is formed into a silicon oxide precursor film 33. This silicon oxide precursor film is in a state that a chain polysilane compound is polymerized; the solvent or the like in the coating film 32 is vaporized; and hydrogen is contained in the film.

Figure 6D:
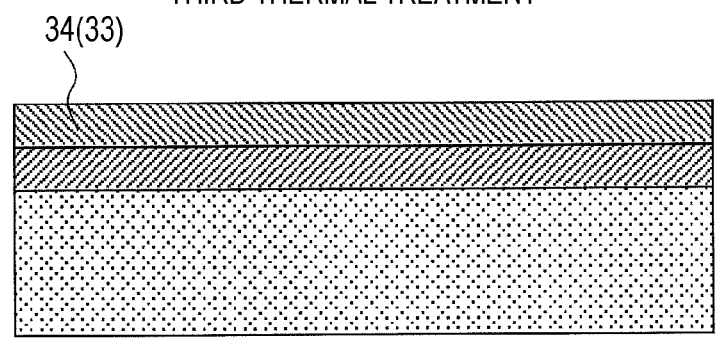

Subsequently, as shown in FIG. 6D, the treatment step at the second stage is an oxidation treatment (third thermal treatment) in an oxidizing atmosphere, and preferably a thermal oxidation treatment in an oxidizing atmosphere. In this third thermal treatment, for example, the thermal treatment is preferably carried out in an oxidizing atmosphere at 180° C. or higher. The thermal treatment is more preferably carried out in an oxidizing atmosphere at 240° C. or higher. In this way, it is more preferable that a maximum temperature of the third thermal treatment is set up at a temperature of a maximum temperature of the second thermal treatment in an inert atmosphere or an oxidizing atmosphere or higher. According to this third thermal treatment, the silicon oxide precursor film 33 is formed into a hydrogen-containing silicon oxide film 34. It is also possible to adopt an oxidation treatment in an oxidizing atmosphere which is not accompanied with a thermal treatment.

Next, the hydrogen-containing silicon oxide film 34 is verified.

The hydrogen-containing silicon oxide film 34 was formed on a quartz substrate by the second example of the film deposition method.

The second thermal treatment in an inert atmosphere was carried out at 180° C. for 30 minutes, at 220° C. for 30 minutes, at 220° C. for 60 minutes and at 250° C. for 30 minutes, respectively. The third thermal treatment in an oxidizing atmosphere was carried out at 410° C. for 30 minutes in all of four samples.

The hydrogen-containing silicon oxide film 34 obtained under each of the foregoing conditions was analyzed by, for example, the Rutherford backscattering spectrometry (RBS). As a result, an existence ratio of silicon (Si) and oxygen (O) was revealed as shown in FIGS. 7A to 7B.

As shown in FIGS. 7A to 7B, in view of the fact that in the hydrogen-containing silicon oxide film 34, a composition ratio (Si/O) of silicon (Si) and oxygen (O) is approximately ½ substantially constantly in a thickness direction, it could be confirmed that a silicon oxide film was formed under the foregoing film deposition condition.

Subsequently, the hydrogen-containing silicon oxide film 34 was formed on a silicon single crystal substrate according to the second example of the film deposition method.

The hydrogen-containing silicon oxide film 34 was formed by setting up the thermal treatment temperature of the third thermal treatment in an oxidizing atmosphere at 500° C., 425° C., 350° C. and 260° C., respectively. Thereafter, a spectrum (transmission) of the hydrogen-containing silicon oxide film 34 formed under each of the foregoing conditions was measured by the Fourier transform infrared spectroscopy (FT-IR). The results obtained are shown in Table 1 and FIG. 8. In Table 1, a thickness of the hydrogen-containing silicon oxide film 34 and a treatment temperature of each of the second thermal treatment and the third thermal treatment are shown.

TABLE 1

| Sample | Film thickness | First annealing (in argon atmosphere) | Second annealing (in oxygen atmosphere) |
|---|---|---|---|
| No. 1 | 269 nm | 260° C. | 500° C. |
| No. 2 | 282 nm | 260° C. | 425° C. |
| No. 3 | 290 nm | 260° C. | 350° C. |

TABLE 1-continued

| Sample | Film thickness | First annealing (in argon atmosphere) | Second annealing (in oxygen atmosphere) |
|---|---|---|---|
| No. 4 | 288 nm | 260° C. | 260° C. |
| No. 5 | — | Not annealed | Not annealed |

As shown in FIG. 8, it could be confirmed that as the temperature of the third thermal treatment increases, the bond between silicon and hydrogen in the hydrogen-containing silicon oxide film 34 decreases.

Subsequently, the hydrogen-containing silicon oxide film 34 was formed on a silicon single crystal substrate according to the second example of the film deposition method.

Six samples in which the treatment temperature in an inert atmosphere was set up at 200° C., 220° C., 240° C., 260° C., 280° C. and 300° C., respectively, and the treatment temperature in an oxidizing atmosphere was set up at 425° C. in all of the instances were formed. An aluminum electrode was formed thereon, and a current-voltage (I-V) characteristic was measured using a current-voltage characteristic analyzer (for example, a device analyzer 4156C, manufactured by Agilent Technologies). The results obtained are shown in FIG. 9. In FIG. 9, the left-hand ordinate expresses a breakdown voltage (BDV) (black-painted rhombs in the diagram); the right-hand ordinate expresses an etching rate (black-painted triangles in the diagram); and the abscissa expresses an annealing temperature.

As a result, as shown in FIG. 9, it was understood that the resistance is high by the thermal treatment at 240° C. or higher, whereas the resistance is low by the thermal treatment at about 300° C. It was understood that in the second thermal treatment in a reducing atmosphere of the treatment step at the first stage, a silicon oxide film with good characteristics can be formed at 240° C. or higher, whereas the oxidation is not promoted at 300° C. or higher, but the formation of a network of silicon is advanced.

In consequence, it was understood that the second thermal treatment is desirably carried out at 240° C. or higher and not higher than 280° C. The thermal treatment is more preferably carried out at 260° C. or higher and not higher than 280° C.

In the second example of the film deposition method, the film deposition is realized in an inert atmosphere and an oxidizing atmosphere, and therefore, film deposition in a vacuum atmosphere is not necessary. Also, the silicon oxide precursor film 33 is formed from the coating film 32 containing a polysilane compound in the second thermal treatment in an inert atmosphere, and therefore, hydrogen is contained in the instant film. Then, the silicon oxide precursor film 33 in a hydrogen-containing state is subjected to the third thermal treatment in an oxidizing atmosphere, and therefore, the hydrogen-containing silicon oxide film 34 whose defect density is lower than that in the related art is obtained. Also, in the third thermal treatment, densification of the silicon film 13 is carried out, and therefore, an active region with good crystallinity can be formed.

Also, different from the thermal oxidation method, the CVD method or the sputtering method, each of which is a technique for forming a silicon oxide film, according to the film deposition method of the foregoing second example, a vacuum-less process can be adopted.

In consequence, investment in plant and equipment can be reduced as compared with the manufacturing method adopting a vacuum process, and the silicon film 13 and the hydrogen-containing silicon oxide film 34 can be formed continuously and at low costs.

Furthermore, a silicon oxide film which is low in a defect density can also be prepared in a large area on a substrate with low heat resistance by a coating method and a simple and easy method which is concerned with a thermal treatment.

The hydrogen-containing silicon oxide film can be used as a film capable of controlling a dangling bond in a silicon substrate or a silicon layer in the same manner as in a hydrogen-containing silicon nitride film of the related art.

At present, in thin film transistors (TFTs) which are used in flat panel displays and thin film silicon solar cells which are considered in solar cells, amorphous silicon (a-Si) is widely used. The "amorphous silicon" as referred to herein is in a solid state not having a crystal structure, and the atomic arrangement of amorphous silicon is one in which the atomic arrangement of crystalline silicon is disordered. In this disordered atomic arrangement, a dangling bond which does not take part in a covalent bond exists. By controlling this dangling bond, there will be a hope of use as a thin film transistor or a thin film silicon solar cell.

As the related-art controlling method of a dangling bond, specifically, there is taken a technique for reducing a trap by bonding the dangling bond to a hydrogen atom. Examples thereof include a glow discharge method for decomposing monosilane ($SiH_4$) by means of glow discharge; an ion plating method in which hydrogen is introduced in vacuo, and silicon (Si) is evaporated by an electron beam; and a cluster ion beam method. In a reactive sputtering method or a CVD method, there may be the case where hydrogen is insufficient, and a treatment with hydrogen plasma may be applied.

In this connection, it is known that even when heated at 2,000° C., hydrogen dissociates to an extent of only about 0.1%, whereas it dissociates at about 5,000° C. On the other hand, the bond between silicon and hydrogen is confirmed even by a treatment with a hydrogen-containing gas (forming gas) at about 350° C. to 400° C.

Also, in the case of polycrystalline silicon (poly-Si) with a higher mobility than that of amorphous silicon (a-Si), as an example, the polycrystalline silicon is formed through poly-crystallization of an amorphous silicon film of plasma enhancement CVD (PECVD) by means of excimer laser annealing (ELA).

However, since hydrogen is contained in an amount of not more than about 10% in the film having been subjected to film deposition at a relatively low temperature, explosive crystallization takes place. For that reason, a dehydration treatment is carried out in advance by means of a heating treatment at from 400° C. to 450° C., thereby controlling the hydrogen concentration to an extent of several %. Thereafter, a trap is reduced by bonding a hydrogen atom to the dangling bond.

Also, in order to obtain a good interface between a semiconductor and an insulating film, it is preferable to carry out continuous film deposition in vacuo. Alternatively, it is also preferable to form an interface in the film by oxidizing the semiconductor surface.

However, in the future, it will be demanded to use a flexible substrate and to prepare a device by means of coating or printing while taking a view of reduction in investment in plant and equipment or the like. On that occasion, the continuous film deposition in vacuo or the oxidation on the semiconductor surface in which a high temperature is required will become difficult.

A silicon oxide film is used as an insulating film, a dielectric film or a surface protective film in preparing a semiconductor device such as field effect transistors.

As to a method for forming such a silicon oxide film, the formation has been carried out in a vapor phase process such as a thermal oxidation method, a chemical vapor deposition method (CVD method) and a sputtering method.

Meanwhile, a liquid phase process includes film deposition by means of hydrolysis with an alkoxysilane or the like; and a formation method by mans of oxidization of a polysilazane or the like.

However, with respect to the foregoing methods, in the vapor phase process, it is necessary to use an expensive vacuum system or a dangerous gas raw material, and the energy consumption is also large due to a high temperature or use of plasma or the like. Also, the vapor phase process involves problems such as restrictions in size of a substrate on which a film is formed and uniformity. Also, the liquid phase process involves a problem such as densification of a film.

As a method for solving these problems, the hydrogen-containing silicon oxide film according to the second example of the film deposition method is effective.

In consequence, in preparing a semiconductor device such as TFTs and solar cells, the hydrogen-containing silicon oxide film 34 is formed by coating a hydrogen-containing polysilane compound and subjecting it to a thermal treatment in place of the hydrogenation step of reducing a dangling bond to be generated in a semiconductor film (for example, a silicon film), whereby hydrogen can be supplied to an arbitrary area (or an adjacent film coming into contact therewith).

Also, the hydrogen-containing silicon oxide film 34 can be formed, by means of coating, and therefore, in a method for manufacturing a semiconductor device, a part or the whole of the process can be carried out by a vacuum-less process which does not use a treatment in a vacuum atmosphere. Furthermore, the hydrogen-containing silicon oxide film 34 can be formed by means of coating and a thermal treatment at a relatively low temperature (for example, not higher than 450° C.), and therefore, it becomes possible to constitute a so-called roll-to-roll process by using an organic material substrate.

<2. Second Embodiment>
[First Example of Manufacturing Method of Semiconductor Device]

A first example of the manufacturing method of a semiconductor device according to the second embodiment of the present invention is described with reference to a schematic configuration sectional view shown in each of FIGS. 10A to 10F.

Figure 10A:
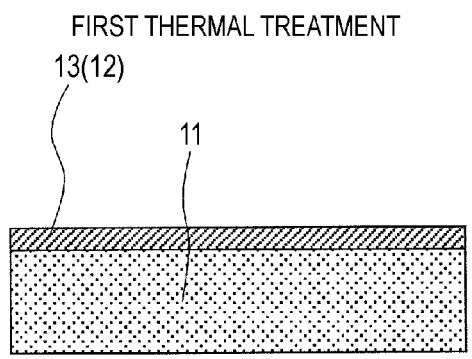

First of all, as shown in FIG. 10A, a solution containing a polysilane compound is coated on a substrate 11 to form a coating film 12, which is then subjected to a first thermal treatment in an inert atmosphere, thereby forming the coating film 12 into a silicon film 13 according to the film deposition method described above with reference to FIGS. 1A to 1C.

As the polysilane compound, those described above are useful.

That is, the polysilane compound is one represented by $Si_nR_m$ (wherein n represents a natural number of 3 or more; m is a number of $(2n-2)$ or more and not more than $(2n+2)$; and R represents an organic chain material, an organic cyclic material, a hydrogen atom, a halogen atom or a metal atom).

When the foregoing R is a hydrogen atom, specific examples of the chain polysilane compound include normal tetrasilane ($Si_4H_{10}$) isotetrasilane ($Si_4H_{10}$) normal pentasilane ($Si_5H_{12}$), isopentasilane ($Si_5H_{12}$), neopentasilane ($Si_8H_{12}$), normal hexasilane ($Si_8H_{14}$), normal heptasilane ($Si_7H_{18}$), normal octasilane ($Si_8H_{18}$), normal nonasilane ($Si_8H_2O$) and isomers thereof.

Also, examples of the cyclic polysilane compound include cyclotetrasilane ($Si_4H_8$), cyclopentasilane ($Si_5H_{10}$) cyclohexasilane ($Si_6H_{12}$) and cycloheptasilane ($Si_7H_{14}$). Besides, cage-shaped polysilane compounds and the like are exemplified.

Also, monosilane ($SiH_4$), disilane ($Si_2H_6$) or trisilane ($Si_3H_8$) in which the foregoing n is less than 3 may be coexistent.

Also, the foregoing solution containing a polysilane compound is one having the polysilane compound dissolved in a solvent. As the solvent, those described above are useful.

That is, examples of such a solvent which is preferable include hydrocarbon based solvents (for example, n-heptane, n-octane, decane, toluene, xylene, cymene, durene, indene, dipentene, tetrahydronaphthalene, decahydronaphthalene, cyclohexylbenzene, etc.); ether based solvents (for example, ethylene glycol dimethyl ether, ethylene glycol diethyl ether, ethylene glycol methylethyl ether, diethylene glycol dimethyl ether, diethylene glycol methylethyl ether, 1,2-dimethoxyethane, bis(2-methoxyethyl)ether, p-dioxane, etc.); and aprotic polar solvents (for example, propylene carbonate, γ-butyrolactone, n-methyl-2-pyrrolidone, dimethylformaldehyde, dimethyl sulfoxide, cyclohexanone, etc.).

Such a solvent can be used singly or in admixture of two or more kinds thereof.

A step of forming the coating film 12 is preferably carried out in an inert atmosphere of argon, nitrogen or the like. Alternatively, hydrogen may be contained.

The first thermal treatment is carried out at a temperature of not higher than 600° C. in an inert atmosphere of argon, nitrogen or the like.

Figure 10B:
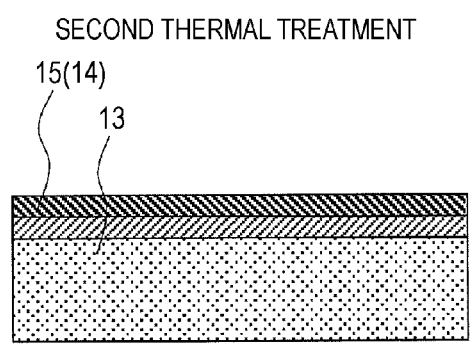

Subsequently, as shown in FIG. 10B, a coating film 14 containing a polysilane compound is formed on the silicon film 13 and then subjected to a second thermal treatment in an inert atmosphere, thereby forming the coating film 14 into a silicon oxide precursor film 15.

As the polysilane compound, those described above are useful.

Also, the foregoing solution containing a polysilane compound is one having the polysilane compound dissolved in a solvent. As the solvent, those described above are useful.

A step of forming the coating film 14 is preferably carried out in an inert atmosphere of argon, nitrogen or the like. Alternatively, hydrogen may be contained.

The second thermal treatment is carried out at a temperature of 200° C. or higher and not higher than 280° C. in an inert atmosphere of argon, nitrogen or the like.

Figure 10C:
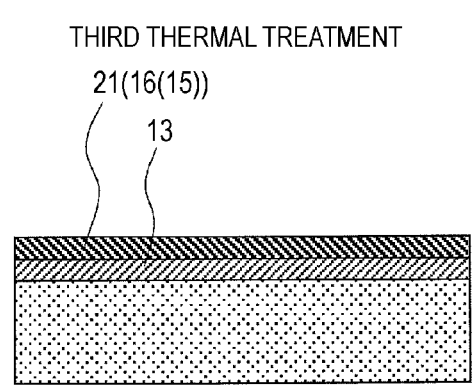

Subsequently, as shown in FIG. 10C, a third thermal treatment is carried out in an oxidizing atmosphere, thereby forming the silicon oxide precursor 15 into a silicon oxide film 16. At the same time, the crystallinity of the silicon film 13 is densified. This silicon oxide film 16 will work as a gate insulating film 21.

A maximum temperature of the third thermal treatment is higher than a maximum temperature of the second thermal treatment.

Figure 10D:
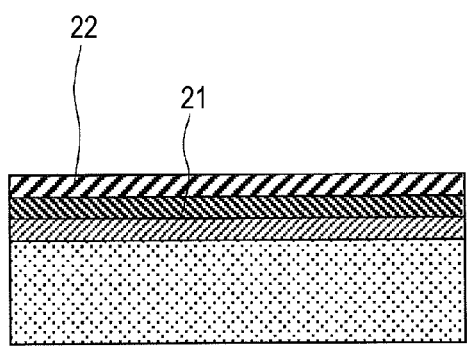

Subsequently, as shown in FIG. 10D, a gate electrode forming film 22 is formed on the gate insulating film 21. Examples of a film deposition method of this gate electrode forming film 22 include a vacuum film deposition technology such as a CVD method, a sputtering method and a vapor deposition method, a method of coating a metal fine particle and sintering it, a plating method and a printing method.

As to a material of the gate electrode forming film 22, for example, a metal or alloy film such as an aluminum film and an aluminum alloy film, a polycrystalline silicon film doped with an impurity, a polycide film and the like can be used.

Figure 10E:
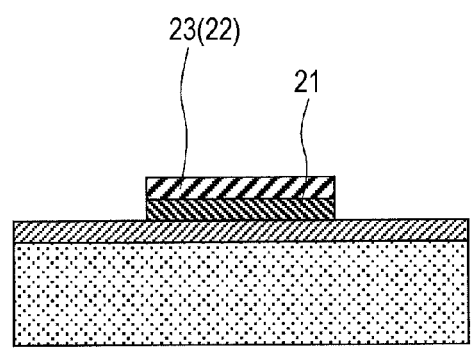

Subsequently, as shown in FIG. 10E, the gate electrode forming film 22 is subjected to patterning using a usual lithography technique, thereby forming a gate electrode 23. Also, the gate insulating film 21 is subjected to patterning by means of this patterning.

For example, in the case of adopting a coating method such as a printing method, the gate electrode 23 can be subjected to pattern formation directly on the gate insulating film 21 without carrying out a lithography step.

Figure 10F:
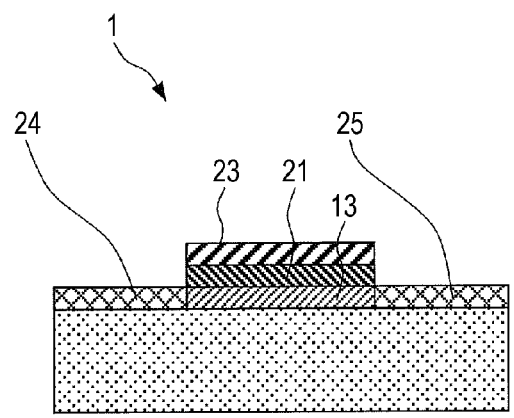

Subsequently, as shown in FIG. 10F, an n-type or p-type impurity ion is injected into the silicon layer 13 on the both sides of the gate electrode 23 while using the gate electrode 23 as a mask by, for example, an ion injection method. Thereafter, the injected impurity ion is activated by carrying out an activation treatment, thereby forming n-type or p-type source/drain regions 24 and 25.

The method of forming the source/drain regions 24 and 25 is not limited to the foregoing ion injection method. For example, an impurity ion is deposited on the silicon film 13 on the both sides of the gate electrode 23 by a technique such as coating, spraying and printing, thereby forming a compound layer (not illustrated). Subsequently, the compound layer and the silicon film 13 just under the compound layer are heated upon irradiation with an energy beam on the surface of the substrate 11 in this state, thereby diffusing the impurity ion from this compound layer into the silicon film 13. On that occasion, when the gate electrode 23 works as a mask, the impurity ion is diffused into a surface part of the silicon film 13 in a region exclusive of a part just under the gate electrode 23, and the n-type or p-type source/drain regions 24 and 25 are self-alignedly formed relative to the gate electrode 23.

Sequent steps are carried out in the same manner as in a usually manufacturing method of a thin film transistor.

While illustration is omitted, for example, an interlayer insulating film (not illustrated) for covering the gate electrode 23 and the source/drain regions 24 and 25 is formed. For this interlayer insulating film, insulating films or dielectric films which are usually used as an interlayer insulating film, such as silicon oxide films, inorganic SOG films and organic SOG films, can be used. As a film deposition method thereof, a vacuum film deposition technology such as a CVD method, a sputtering method and a vapor deposition method, or an SOG method, a sol-gel method or the like is adopted.

Subsequently, a prescribed portion of the foregoing interlayer insulating film is etching-removed to form contact holes reaching the source/drain regions 24 and 25, and source/drain electrodes to be connected to the source/drain regions 24 and 25 through the contact holes are formed.

As to the manufacturing method of the semiconductor device 1 according to the embodiment of the present invention, the film deposition of the silicon oxide film 16 which is used for the gate insulating film 21, which is low in a defect density, can be realized by a low-temperature process without adopting film deposition in a vacuum atmosphere. Also, the gate insulating film 21 composed of the dense silicon oxide film 16 can be realized, and therefore, the semiconductor device (FET) 1 which is free from gate leakage can be realized. Furthermore, crystallinity of the silicon film 13 is enhanced, and therefore, there is an advantage that the semiconductor device (FET) 1 with an excellent mobility can be realized.

Also, as described previously, in the case where the silicon oxide film 16 which is formed by the film deposition method according to the embodiment of the present invention is applied to a semiconductor device, the gate insulating film 21 of an insulating gate type field effect transistor can be prepared with good productivity at low costs while suppressing the investment in plant and equipment.

Furthermore, TFT or the like can be prepared as a semiconductor device on a substrate having a large area as in display devices, and therefore, its applications are spread, whereby its added value tremendously increases.

In particular, in view of the fact that the film deposition by a low-temperature process is possible, a substrate with low heat resistance can be used. For example, organic materials, especially plastic materials can be used; for example, a roll-to-roll process can be adopted as a technique for preparing a silicon oxide film; and take-up as a device is possible, or a display device having flexibility can be realized.

[Second Example of Manufacturing Method of Semiconductor Device]

A second example of the manufacturing method of a semiconductor device according to the second embodiment of the present invention is described with reference to a manufacturing step sectional view shown in each of FIGS. 11A to 11D.

Figure 11A:
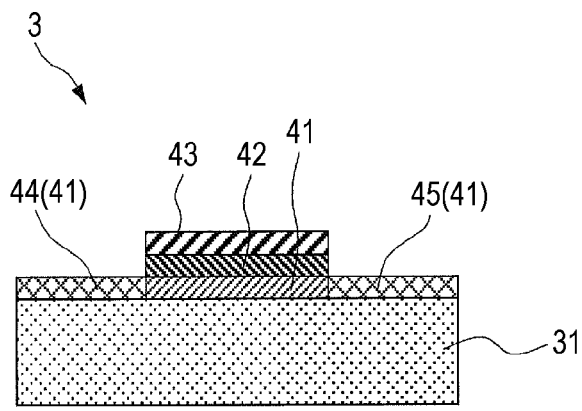

First of all, as shown in FIG. 11A, a silicon film 41 is formed on a substrate 31 according to the film deposition method of the silicon film 13 as described above with reference to FIGS. 1A to 1C, and a thin film transistor 3 is then formed using this silicon film 41 as an active layer. This thin film transistor 3 is formed in the following manner.

A gate electrode 43 is formed on the silicon film 41 via a gate insulating film 42, and source/drain regions 44 and 45 are formed on the silicon film 41 on the both sides of this gate electrode 43.

Figure 11B:
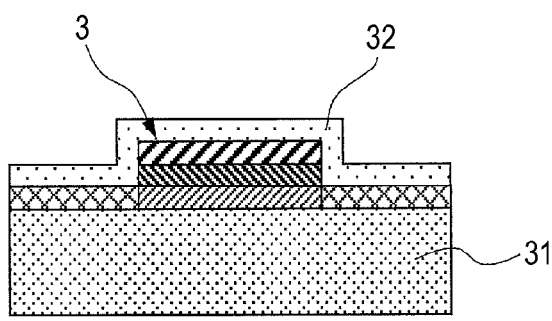
Figure 11C:
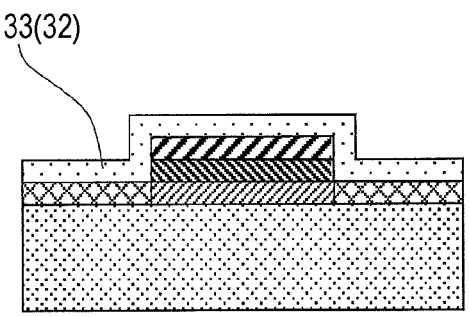
Figure 11D:
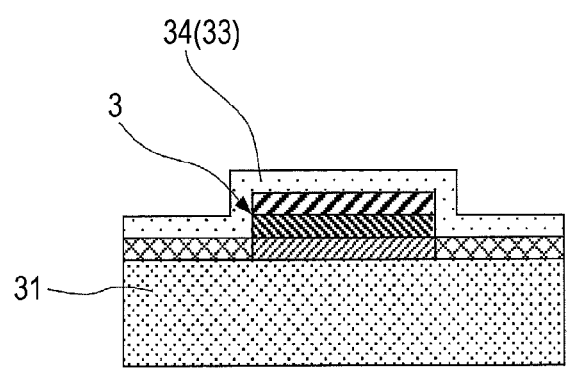

Subsequently, after going through steps shown in FIGS. 11B and 11C, as shown in FIG. 11D, a hydrogen-containing silicon oxide film 34 is formed on the substrate 31, thereby covering the thin film transistor 3.

A step of forming the hydrogen-containing silicon oxide film 34 is carried out in the following manner.

First of all, as shown in FIG. 11B, a coating film 32 containing a polysilane compound is formed such that the thin film transistor 3 is covered on the substrate 31. This coating film 32 is the same as that described in the foregoing second example of the film deposition method.

Thereafter, as shown in FIG. 11C, a second thermal treatment is carried out in an inert atmosphere in the same manner as that described in the foregoing second example of the film deposition method, thereby forming the coating film 32 into a silicon oxide precursor film 33.

Subsequently, as shown in FIG. 11D, a third thermal treatment is carried out in an oxidizing atmosphere in the same manner as that described in the foregoing second example of the film deposition method, thereby forming the hydrogen-containing silicon oxide film 34 from the silicon oxide precursor film 33. In this way, the hydrogen-containing silicon film 34 is formed on the substrate 31, thereby covering the thin film transistor 3.

As a method for forming the thin film transistor 3, the manufacturing method of a semiconductor device as described above with reference to FIGS. 10A to 10F can be adopted.

Next, the hydrogen-containing silicon oxide film 34 was verified. The hydrogen-containing silicon oxide film 34 was formed on a silicon single crystal substrate by the foregoing method. On that occasion, a thermal treatment was carried out at 260° C. in an inert atmosphere, and subsequently, a thermal treatment was carried out at 260° C. in an oxidizing atmosphere.

The hydrogen-containing silicon oxide film 34 was analyzed by the thermal desorption spectroscopy (TDS). The results obtained by keeping it at 100° C. for 120 minutes are shown in FIG. 12.

As shown in FIG. 12, though the temperature is about 100° C., hydrogen is detected in the largest amount, and it can be confirmed that hydrogen is continuously emitted similar to carbon monoxide or nitrogen. Though a large amount of water is also detected at the initial stage of the measurement, it is understood that a very large amount of hydrogen is emitted at about 100° C. because it is also emitted from the substrate or other members. That is, it is understood that hydrogen is contained in the hydrogen-containing silicon oxide film 34.

Next, TFTs of a top gate type poly-Si gate were prepared.

In a crystallization process of a silicon film which will serve as an active layer of TFT during the preparation process, annealing for dehydrogenation was carried out in vacuo at 500° C. before carrying out crystallization by means of excimer laser annealing (ELA).

A sample in which a process for supplying hydrogen to the foregoing silicon film was omitted in the sequent process is shown as an "as-depo sample" in the drawing (a hydrogen-containing silicon oxide film is not subjected to film deposition).

Also, a first sample by means of film deposition of a hydrogen-containing silicon oxide film at 260° C. (in an inert atmosphere) and then at 260° C. (in an oxidizing atmosphere); and a second sample by means of film deposition of a hydrogen-containing silicon oxide film at 260° C. (in an inert atmosphere) and then at 425° C. (in an oxidizing atmosphere) were prepared, respectively in the same manner as in the foregoing second example of the manufacturing method.

In each of the samples, after the film deposition of a silicon oxide film, contact holes were prepared using, for example, a hydrofluoric acid based etching solution.

An I-V characteristic of each of the foregoing TFTs was then measured. The results obtained are shown in a relational diagram between a drain current and a gate voltage of TFT in FIG. 13.

As shown in FIG. 13, an effect of hydrogenation of the silicon film could be confirmed in all of the first sample and the second sample using a hydrogen-containing silicon oxide film having been subjected to film deposition in the second example of the film deposition method as compared with the as-depo sample.

Next, TFTs of a top gate type poly-Si gate were prepared in the same manner as described above.

Similar to the above-described case, a sample in which a process for supplying hydrogen to the silicon film of TFT was omitted is shown as an "as-depo sample" in the drawing.

Also, a sample in which hydrogen was supplied to the silicon film of TFT by means of annealing for 20 minutes in a hydrogen gas-containing atmosphere at 350° C. is designated as a "sample after as-depo hydrogenation".

Furthermore, a third sample by means of film deposition of a hydrogen-containing silicon oxide film on the sample after as-depo hydrogenation at 260° C. (in an inert atmosphere) and then at 260° C. (in an oxidizing atmosphere) was compared.

The results obtained are shown in a relational diagram between a drain current and a gate voltage of TFT in FIG. 14.

As shown in FIG. 14, in view of the fact that there is no substantial difference between the sample after as-depo hydrogenation and the third sample, it could be confirmed that the TFT characteristic is not deteriorated under the thermal treatment condition at 260° C.

Next, similar to the above-described case, TFT of a top gate type poly-Si gate was prepared.

After the hydrogenation, a sample by means of film deposition of a silicon oxide film at 260° C. (at 260° C. (in the air) and then at 260° C. (in an oxygen ($O_2$) atmosphere)) was prepared. An (Id-Vg) characteristic of the sample between a drain current and a gate voltage was measured. As a result, as shown in a relational diagram between a drain current and a gate voltage of TFT in FIG. 15, a "pas" curve was obtained.

The foregoing sample was kept in the air for 14 days as it was and then measured for the Id-Vg characteristic. As a result, as shown in FIG. 15, a "Day 14 (in the air)" curve was obtained.

Thereafter, the foregoing sample was subjected to a thermal treatment at 425° C. in an oxygen atmosphere and measured for the Id-Vg characteristic in an oxygen ($O_2$) atmosphere at 425° C. As a result, as shown in FIG. 15, a "425° C. (in an oxygen atmosphere)" curve was obtained.

Thereafter, the foregoing sample having been subjected to a thermal treatment was kept in an atmosphere at a temperature of 60° C. and a humidity of 90%.

Then, the sample after an elapse of the prescribed number of days in the foregoing atmosphere was taken out and provided for the measurement. As a result, as shown in FIG. 15, "Day 7", "Day 10", "Day 21", "Day 45" and "Day 143" curves were obtained.

It was understood that after the foregoing thermal treatment, though the Id-Vg characteristic was slightly changed, the stable characteristic was obtained in an atmosphere at a temperature of 60° C. and a humidity of 90% until an elapse of 143 days.

It could be confirmed from these results that a dehydrogenation reaction in which hydrogen comes out through the hydrogen-containing silicon oxide film was not generated.

In the foregoing second manufacturing method of a semiconductor device, the film deposition is realized in an inert atmosphere and a reducing atmosphere, and therefore, film deposition in a vacuum atmosphere is not necessary. Also, the silicon oxide precursor film 33 is formed from the coating film 32 containing a polysilane compound by the second thermal treatment in a reducing atmosphere, and therefore, hydrogen is contained in the film. Furthermore, the silicon oxide precursor film 33 in a hydrogen-containing state is subjected to the third thermal treatment in an oxidizing atmosphere, and therefore, a hydrogen-containing dense silicon oxide film 34 is obtained. Also, in the third thermal treatment, densification of the silicon film 41 of the thin film transistor 3 is carried out, and therefore, an active region with good crystallinity can be formed.

In consequence, the silicon oxide film 34 in a hydrogen-containing state, which is low in a defect density, can be obtained by a low-temperature process without adopting film deposition in a vacuum atmosphere.

The present application contains subject matter related to that disclosed in Japanese Priority Patent Applications JP 2009-023219 and JP 2009-216362 filed in the Japan Patent Office on Feb. 4, 2009 and Sep. 18, 2009, respectively, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A film deposition method comprising the steps of:
    coating a substrate with a solution containing a polysilane compound to form a first coating film and then carrying out a first thermal treatment in an inert atmosphere to convert the first coating film into a silicon film;

forming a second coating film containing a polysilane compound on the silicon film and then carrying out a second thermal treatment on the silicon film and the second coating film in an inert atmosphere or a reducing atmosphere, the second thermal treatment being effective to convert the second coating film into a silicon oxide precursor film; and carrying out a third thermal treatment on the silicon film and the silicon oxide precursor film in an oxidizing atmosphere, the third thermal treatment being effective to (a) convert the silicon oxide precursor film into a silicon oxide film, and simultaneously (b) densify the silicon film while not oxidizing the silicon film.

2. The film deposition method according to claim 1, wherein the polysilane compound is one represented by $Si_nR_m$, wherein n represents a natural number of 3 or more; m is a number of (2n-2) or more and not more than (2n+2); and R represents an organic chain material, an organic cyclic material, a hydrogen atom, a halogen atom or a metal atom; and the solution containing a polysilane compound is one having the polysilane compound dissolved in a solvent.

3. The film deposition method according to claim 1 or 2, wherein the second thermal treatment is carried out at a temperature of 200° C. or higher and not higher than 280° C. in an inert atmosphere.

4. The film deposition method according to claim 1 or 2, wherein the second thermal treatment is carried out at a temperature of 240° C. or higher and not higher than 280° C. in a reducing atmosphere.

5. The film deposition method according to claim 1 or 2, wherein the second thermal treatment is carried out in an inert atmosphere; and a maximum temperature of the third thermal treatment is higher than a maximum temperature of the second thermal treatment.

6. A method for manufacturing a semiconductor device comprising the steps of:

coating a substrate with a solution containing a polysilane compound to form a first coating film and then carrying out a first thermal treatment in an inert atmosphere to convert the first coating film into a silicon film;

forming a second coating film containing a polysilane compound on the silicon film and then carrying out a second thermal treatment on the silicon film and the second coating film in an inert atmosphere, the second thermal treatment being effective to convert the second coating film into a silicon oxide precursor film;

carrying out a third thermal treatment on the silicon film and the silicon oxide precursor film in an oxidizing atmosphere, the third thermal treatment being effective to (a) convert the silicon oxide precursor film into a silicon oxide film, and simultaneously (b) densify the silicon film while not oxidizing the silicon film;

forming a gate electrode on the silicon oxide film; and forming a source/drain region in the silicon film on the both sides of the gate electrode.

7. A method for manufacturing a semiconductor device comprising the steps of:

forming a silicon film on a substrate and forming a thin film transistor using the silicon film for an active layer; and forming a hydrogen-containing silicon oxide film on the substrate, thereby covering the thin film transistor, wherein the step of forming a silicon film includes coating a substrate with a solution containing a polysilane compound to form a first coating film and then carrying out a first thermal treatment in an inert atmosphere to convert the first coating film into a silicon film; and the step of forming a hydrogen-containing silicon oxide film includes the steps of:

forming a second coating film containing a polysilane compound so as to cover the thin film transistor on the substrate and then carrying out a second thermal treatment on the silicon film and the second coating film in a reducing atmosphere, the second thermal treatment being effective to convert the second coating film into a silicon oxide precursor film; and carrying out a third thermal treatment on the silicon film and the silicon oxide precursor film in an oxidizing atmosphere, the third thermal treatment being effective to convert the silicon oxide precursor film into a hydrogen-containing silicon oxide film while not oxidizing the silicon film.

8. The film deposition method according to claim 3, wherein:

the second thermal treatment is carried out in an inert atmosphere; and a maximum temperature of the third thermal treatment is higher than a maximum temperature of the second thermal treatment.

9. The method of claim 1, wherein:

the second thermal treatment is performed at lower temperature than the first thermal treatment.

* * * * *